US009720330B2

(12) United States Patent
Guo

(10) Patent No.: US 9,720,330 B2
(45) Date of Patent: Aug. 1, 2017

(54) METHODS FOR MAKING MICRO- AND NANO-SCALE CONDUCTIVE GRIDS FOR TRANSPARENT ELECTRODES AND POLARIZERS BY ROLL TO ROLL OPTICAL LITHOGRAPHY

(71) Applicant: THE REGENTS OF THE UNIVERSITY OF MICHIGAN, Ann Arbor, MI (US)

(72) Inventor: Lingjie Jay Guo, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 0 days.

(21) Appl. No.: 14/395,358

(22) PCT Filed: Apr. 15, 2013

(86) PCT No.: PCT/US2013/036582
§ 371 (c)(1),
(2) Date: Oct. 17, 2014

(87) PCT Pub. No.: WO2013/158543
PCT Pub. Date: Oct. 24, 2013

(65) Prior Publication Data
US 2015/0064628 A1  Mar. 5, 2015

Related U.S. Application Data

(60) Provisional application No. 61/625,507, filed on Apr. 17, 2012.

(51) Int. Cl.
*G03F 7/22* (2006.01)
*G03F 7/30* (2006.01)
(Continued)

(52) U.S. Cl.
CPC ............ *G03F 7/7025* (2013.01); *B82Y 10/00* (2013.01); *G03F 7/24* (2013.01); *G03F 7/30* (2013.01);
(Continued)

(58) Field of Classification Search
CPC . G03F 7/7025; G03F 7/30; G03F 7/24; B82Y 10/00; H01L 51/442;
(Continued)

(56) References Cited

U.S. PATENT DOCUMENTS 4,818,661 A * 4/1989 Taylor et al. .................. 430/320
4,888,266 A * 12/1989 Lacotte et al. ................ 430/141
(Continued)

FOREIGN PATENT DOCUMENTS

JP  59-200419  * 11/1984
JP  08-179493  * 7/1996
(Continued)

OTHER PUBLICATIONS

McNab, "Evanescent Near field Optical Lithography: Overcoming the diffraction limit" Thesis Univ. Canterbury (NZ) 222 pages (2001).*
(Continued)

*Primary Examiner* — Martin Angebranndt
(74) *Attorney, Agent, or Firm* — Harness, Dickey & Pierce, P.L.C.

(57) ABSTRACT

Methods of micro- and nano-patterning substrates to form transparent conductive electrode structures or polarizers by continuous near-field optical nanolithography methods using a roll-type photomask or phase-shift mask are provided. In such methods, a near-field optical nanolithography technique uses a phase-shift or photo-mask roller that comprises a rigid patterned externally exposed surface that transfers a pattern to an underlying substrate. The roller
(Continued)

device may have an internally disposed radiation source that generates radiation that passes through the rigid patterned surface to the substrate during the patterning process. Sub-wavelength resolution is achieved using near-field exposure of photoresist material through the cylindrical rigid phase-mask, allowing dynamic and high throughput continuous patterning.

27 Claims, 14 Drawing Sheets

(51) Int. Cl.
| | |
|---|---|
| *G03B 27/22* | (2006.01) |
| *G03F 7/20* | (2006.01) |
| *H01L 51/00* | (2006.01) |
| *H01L 51/44* | (2006.01) |
| *B82Y 10/00* | (2011.01) |
| *G03F 7/24* | (2006.01) |
| H01L 51/42 | (2006.01) |
| G02F 1/1343 | (2006.01) |
| G02F 1/1335 | (2006.01) |

(52) U.S. Cl.
CPC ........ *H01L 51/0023* (2013.01); *H01L 51/442* (2013.01); *G02F 1/13439* (2013.01); *G02F 2001/133548* (2013.01); *H01L 51/0036* (2013.01); *H01L 51/0047* (2013.01); *H01L 51/4253* (2013.01); *Y02E 10/549* (2013.01)

(58) Field of Classification Search
CPC ............. H01L 51/0023; H01L 51/4253; H01L 51/0047; H01L 51/0036; G02F 2001/133548; G02F 1/13439; Y02E 10/549; G03B 27/22
See application file for complete search history.

(56) References Cited

U.S. PATENT DOCUMENTS

| | | | | |
|---|---|---|---|---|
| 5,710,483 | A * | 1/1998 | Peng ...................... | H01J 3/022 313/309 |
| 6,045,980 | A * | 4/2000 | Edelkind et al. ............. | 430/320 |
| 6,284,437 | B1 * | 9/2001 | Kashyap ...................... | 430/321 |
| 6,344,367 | B1 * | 2/2002 | Naya et al. ...................... | 438/32 |
| 6,373,436 | B1 * | 4/2002 | Chen ............................ | 342/362 |
| 7,538,858 | B2 * | 5/2009 | Mackey .......................... | 355/78 |
| 8,182,982 | B2 | 5/2012 | Kobrin | |
| 8,192,920 | B2 | 6/2012 | Kobrin | |
| 8,318,386 | B2 | 11/2012 | Kobrin | |
| 8,334,217 | B2 | 12/2012 | Kobrin | |
| 2002/0180941 | A1 * | 12/2002 | Hansen .......................... | 355/53 |
| 2006/0014108 | A1 * | 1/2006 | Ito et al. ......................... | 430/322 |
| 2006/0099533 | A1 * | 5/2006 | Nihei et al. ..................... | 430/321 |
| 2006/0283539 | A1 | 12/2006 | Slafer | |
| 2008/0117509 | A1 * | 5/2008 | Hayashi ............... | G02B 5/3058 359/485.05 |
| 2009/0045163 | A1 * | 2/2009 | Lambertini ............ | B82Y 10/00 216/24 |
| 2009/0046362 | A1 | 2/2009 | Guo et al. | |
| 2009/0253227 | A1 † | 10/2009 | Defries | |
| 2009/0269705 | A1 | 10/2009 | Kobrin | |
| 2009/0297989 | A1 | 12/2009 | Kobrin | |
| 2009/0305513 | A1 | 12/2009 | Kobrin | |
| 2010/0026938 | A1 * | 2/2010 | Hattori ................ | G02F 1/33345 349/96 |
| 2010/0035163 | A1 | 2/2010 | Kobrin | |
| 2010/0123885 | A1 | 5/2010 | Kobrin | |
| 2010/0136868 | A1 * | 6/2010 | Chien .................... | G06F 3/0412 445/24 |
| 2010/0155974 | A1 * | 6/2010 | Oliveira et al. ............. | 264/1.38 |
| 2010/0203454 | A1 † | 8/2010 | Brongersma | |
| 2010/0302481 | A1 * | 12/2010 | Baum .............. | B29D 11/00634 349/96 |
| 2011/0007011 | A1 * | 1/2011 | Mozdzyn ................ | G06F 3/044 345/173 |
| 2012/0162629 | A1 | 6/2012 | Kobrin | |
| 2012/0305523 | A1 * | 12/2012 | Fernando et al. .............. | 216/24 |
| 2013/0126468 | A1 * | 5/2013 | Kim ..................... | G02B 5/3058 216/24 |
| 2013/0224636 | A1 † | 8/2013 | Kobrin | |

FOREIGN PATENT DOCUMENTS

| | | | |
|---|---|---|---|
| JP | 2005-085965 | * | 3/2005 |
| KR | 10-2011000815 A | | 1/2011 |
| WO | WO-2008128365 A1 | | 10/2008 |
| WO | 2009/094009 | * | 7/2009 |
| WO | WO-2009094009 A1 | | 7/2009 |
| WO | WO-2010007405 A1 | | 1/2010 |
| WO | WO-2011087896 A2 | | 7/2011 |
| WO | 2012/027050 | * | 3/2012 |

OTHER PUBLICATIONS

Michel et al., "Printing meets lithography soft approaches to high resolution patterning", IBM J. Res. Dev., vol. 45(5) pp. 697-719 (Sep. 2001).*
Hesjedal et al. "Near-field elastomeric mask photolithography fabrication of high-frequency surface acoustic wave transducers" Nanotech., 14 pp. 91-94 (2003).*
International Search Report and Written Opinion of the International Searching Authority for PCT/US2013/036582, mailed Jul. 18, 2013; ISA/KR.
Jong G. Ok et al., "Photo-Roll Lithography (PRL) for Continuous and Scalable Patterning with Application in Flexible Electronics," 25 Advanced Materials, pp. 6554-6561 (2013).
Moon Ku Kwak et al., "Continuous Phase-Shift Lithography with a Roll-Type Mask and Application to Transparent Conductor Fabrication," 23 Nanotechnology, 344008 (2012).
Jeon, Seokwoo et al. Molded transparent photopolymers and phase shift optics for fabricating three dimensional nanostructures. Opt Express. Vol. 15. No. 10. pp. 6358-66. (2007).
Phable™—Made Nanostructures—Eulitha. Accessed on Feb. 17, 2017 at http://www.eulitha.com/products/standard-patterns/phable-made/.

* cited by examiner
† cited by third party

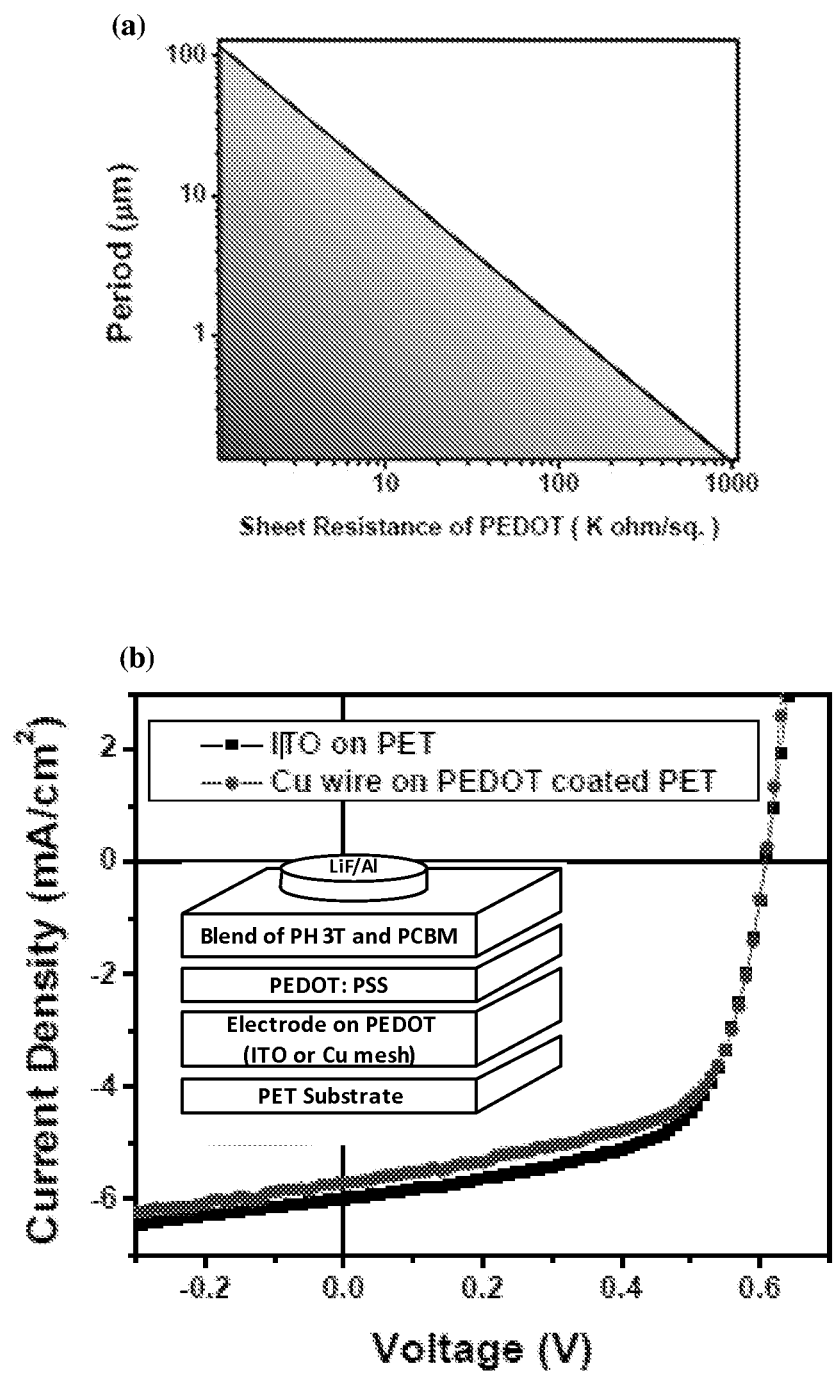
Figures 7(a)-(b)

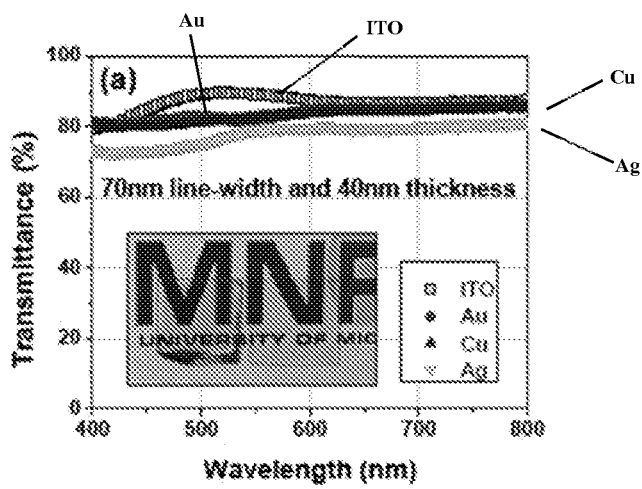
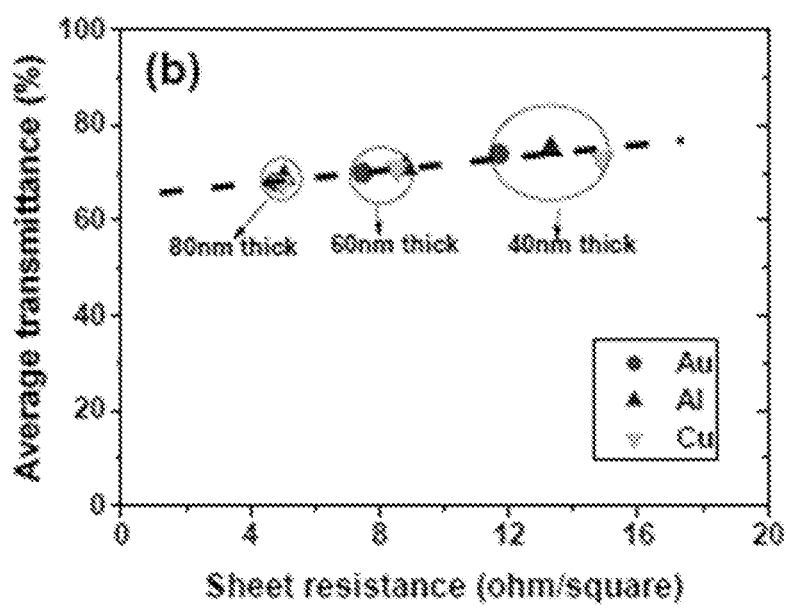
Figures 8(a)-(b)

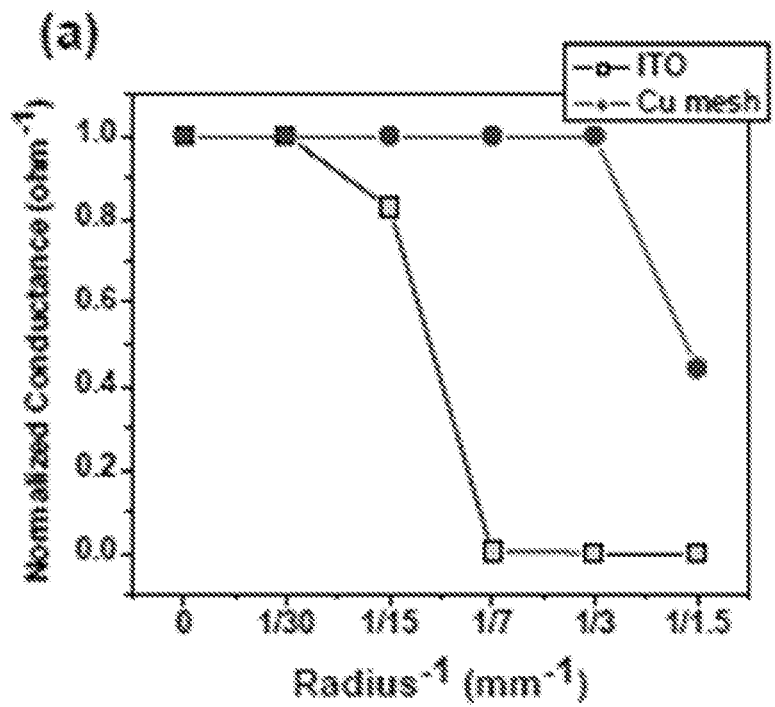
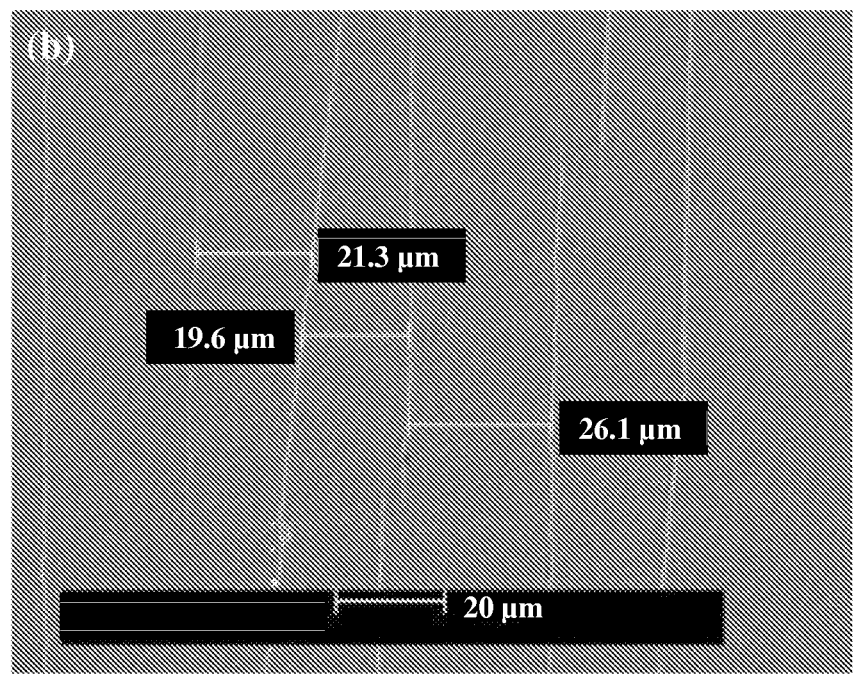
Figures 9(a)-(b)

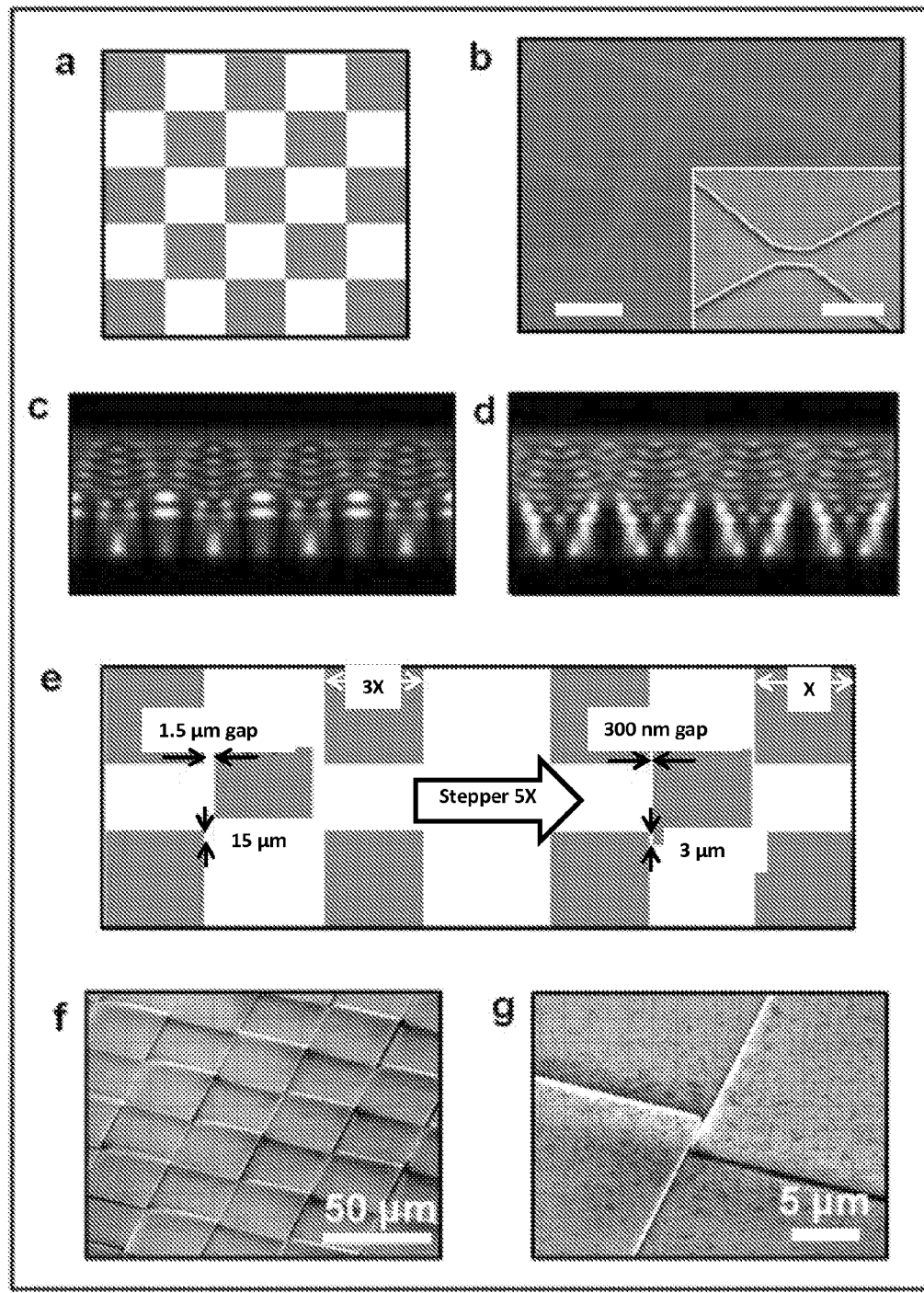
Figures 10(a)-(g)

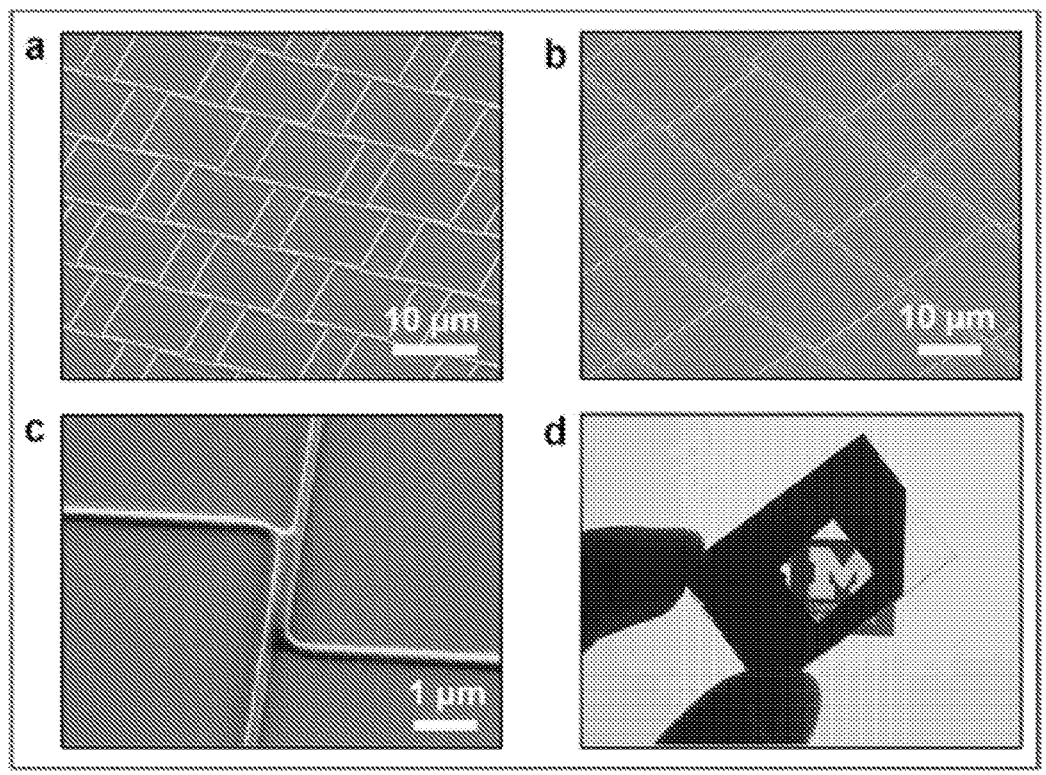
Figures 11(a)-(d)

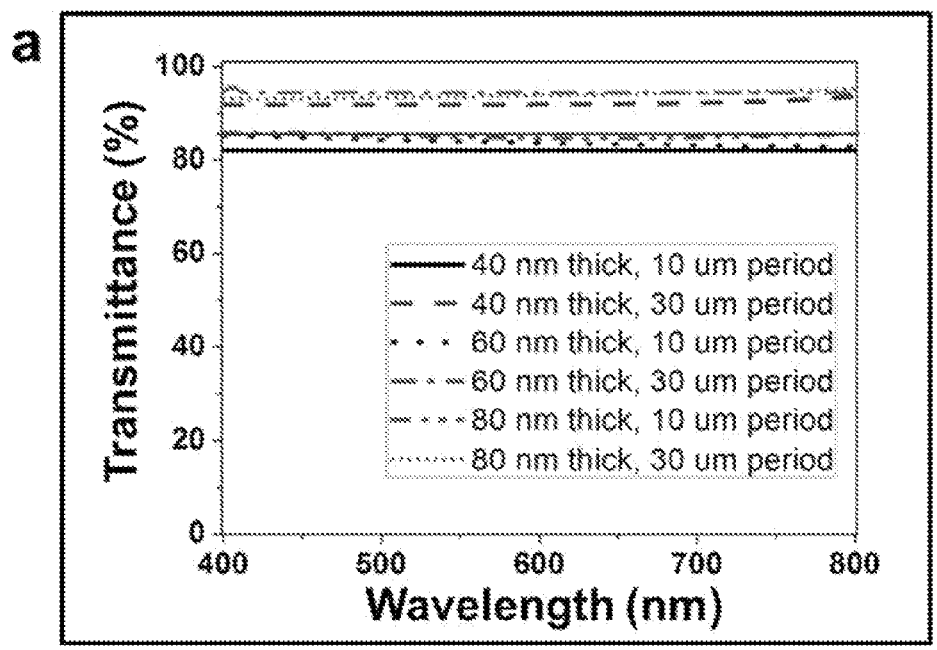
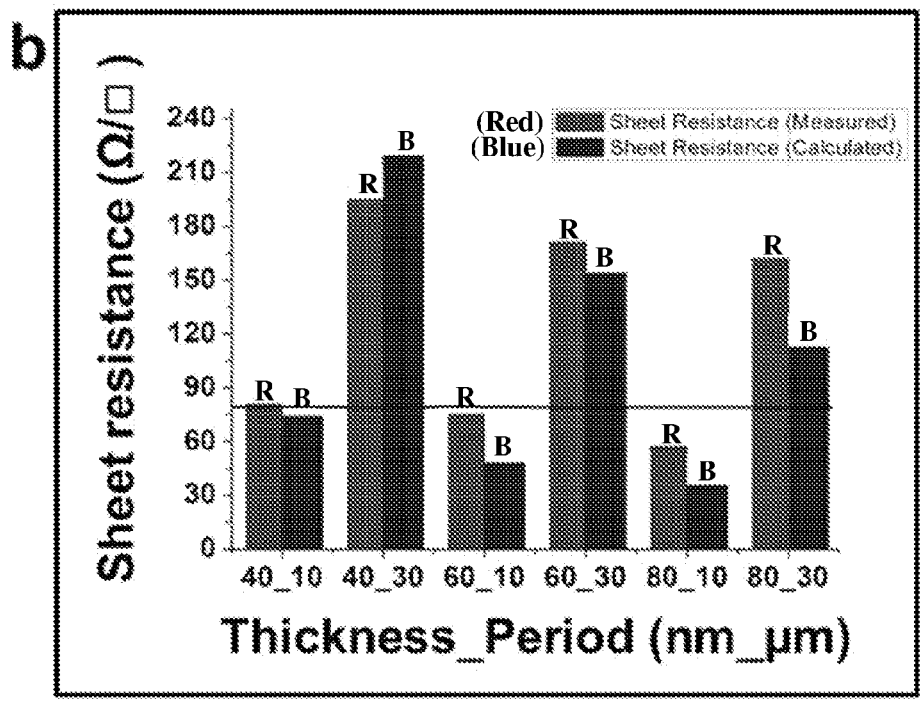
Figures 13(a)-(b)

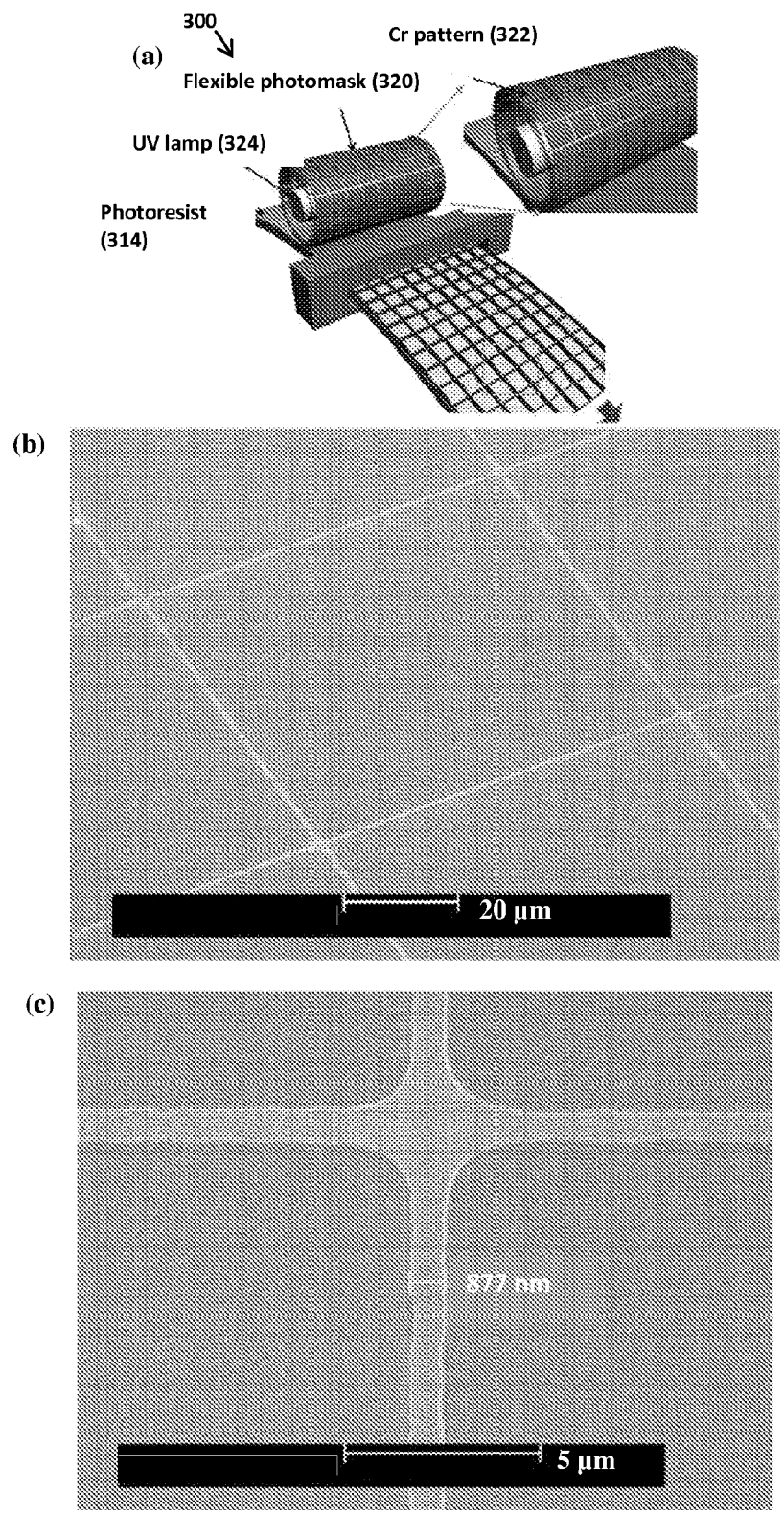
Figures 14(a)-(c)

METHODS FOR MAKING MICRO- AND NANO-SCALE CONDUCTIVE GRIDS FOR TRANSPARENT ELECTRODES AND POLARIZERS BY ROLL TO ROLL OPTICAL LITHOGRAPHY

CROSS-REFERENCE TO RELATED APPLICATIONS

This application claims the benefit of U.S. Provisional Application No. 61/625,507, filed on Apr. 17, 2012. The entire disclosure of the above application is incorporated herein by reference.

FIELD

The present disclosure relates to methods of making metallic wire gratings and grids for use as transparent conductive electrodes or polarizer structures via a new roll-to-roll processing technique employing optical lithography.

BACKGROUND

This section provides background information related to the present disclosure which is not necessarily prior art.

There is increasing demand for large-area, low-cost, rapid nanofabrication techniques for many applications. Such applications include nanostructured self-cleaning surfaces, biomimetic dry adhesives, nanopatterned light-trapping layers and nanostructured absorbers for photovoltaic devices, transparent electrodes, wire-grid polarizers for display devices, and optical metamaterials, by way of non-limiting example. For example, demand for transparent electrodes and wire-grid polarizers has been soaring due to their use in a wide range of applications, like in liquid crystal displays (LCDs), touch panels, organic light emitting diodes (OLEDs), organic photovoltaic devices, and the like. There has been increasing interest in finding alternatives to the most commonly used transparent oxide indium tin oxide (ITO) because of chemical and physical limitations and high cost of ITO electrode. For this reason, the mass production method of metal or other conductive transparent electrodes (e.g., wire grids formed from nanofabrication techniques) is the most promising alternative for ITO electrodes and thus of particular significance. However, currently available nanopatterning and fabrication techniques are still unable to meet the required performance, fabrication speed, and cost criteria for such large-area patterning applications, for example, for making such transparent conductive electrodes or other structures comprising nanofabricated wire grids. Thus, improved nanopatterning processes are needed that are high speed, low cost, and provide superior patterning fidelity.

SUMMARY

This section provides a general summary of the disclosure, and is not a comprehensive disclosure of its full scope or all of its features.

In various aspects, the present disclosure provides for methods of micro-patterning or nano-patterning a substrate. In certain variations, a method for forming a transparent metal electrode by nanolithography is provided. In other variations, a method for forming a polarizer by nanolithography is provided. Thus, in one aspect, a method for forming a conductive micro-grating or nano-grating structure comprises passing a substrate comprising a conductive material, such as a layer of conductive material, having a radiation sensitive material disposed thereon, such as a curable photoresist material, under a rigid patterned surface of a roller device. Radiation or an electronic beam energy is directed through one or more regions of the rigid patterned surface. In certain variations, radiation passes through one or more regions of the rigid patterned surface to the radiation curable photoresist material, so as to cure one or more preselected regions of the radiation curable photoresist material on the substrate. In one embodiment, radiation is generated from a radiation source disposed inside the roller device. In an alternative embodiment, the radiation passing through one or more regions of the rigid patterned surface may be reflected by a reflector component disposed inside the roller device. The internal reflector component thus reflects radiation from an external source directed at the roller device up through the one or more regions of the rigid patterned surface. The method further comprises removing the uncured radiation curable photoresist material and the underlying conductive material in regions outside the one or more preselected regions (that comprise the cured photoresist material). The removing of the uncured radiation photoresist material and the underlying conductive material may comprise an etching process. Next, the cured photoresist material is then removed from the cured one or more preselected regions, so that the underlying conductive material defines a conductive grating structure.

In another aspect, the present disclosure provides methods for forming a conductive grating by phase shift lithography, where the method comprises passing a substrate comprising a layer of conductive material further having a radiation curable photoresist material disposed thereon under a rigid patterned surface of a roller phase mask device. The rigid patterned surface forms a phase mask. Radiation may be generated from a radiation source disposed inside the roller phase mask device. Thus, radiation passes through one or more regions of the rigid patterned surface of the phase mask to the radiation curable photoresist material, so as to cure one or more preselected regions of the radiation curable photoresist material on the substrate via phase shift lithography. The method further includes etching the substrate to remove uncured radiation curable photoresist material and the underlying conductive material in regions outside the one or more preselected regions comprising cured photoresist material. Finally, the cured photoresist material is removed from the cured preselected regions, so that the underlying conductive material defines a conductive micro-scale or nano-scale grating structure.

In another variation, the present disclosure provides methods for forming a conductive grating by optical photolithography, where the method comprises passing a substrate comprising a layer of conductive material having a radiation curable photoresist material disposed thereon under a rigid patterned surface of a roller photomask device. The rigid patterned surface forms a photomask. Radiation can be generated from a radiation source disposed inside the roller photomask device. Thus, radiation passes through one or more regions of the rigid patterned surface of the photomask to the radiation curable photoresist material, so as to cure one or more preselected regions of the radiation curable photoresist material on the substrate via optical lithography. Thus, the patterning is optionally conducted in a roll-to-roll continuous process by using the roller phase mask device. The method further includes etching the substrate to remove uncured radiation curable photoresist material and the underlying conductive material in regions outside the one or more preselected regions comprising cured photoresist material. Finally, the cured photoresist material is removed from the cured preselected regions, so that the underlying conductive material defines a conductive grating structure, such as a micro-scale or nano-scale grating structure.

In yet another aspect, a method is provided for forming a transparent conductive electrode structure or a polarizer by phase shift lithography in a roll-to-roll process. The method comprises passing a substrate comprising a layer of conductive material having a radiation curable photoresist material disposed thereon under a rigid patterned surface of a roller phase mask device. The rigid patterned surface forms a phase mask. Radiation may be generated from a radiation source disposed inside the roller phase mask device that passes through one or more regions of the rigid patterned surface to the radiation curable photoresist material, so as to cure one or more preselected regions of the radiation curable photoresist material on the substrate. The substrate is etched to remove uncured radiation curable photoresist material and the underlying conductive material in regions outside the one or more preselected regions comprising cured photoresist material. Finally, the cured photoresist material is removed from the cured preselected regions, so that the underlying conductive material defines a conductive micro-scale sub-wavelength grating structure is capable of use as a transparent conductive electrode structure or a polarizer structure.

In other aspects, the present disclosure provides for methods of micro-patterning or nano-patterning a substrate that comprises a radiation sensitive material disposed thereon, such as a positive photoresist material. The substrate is passed under a rigid patterned surface of a roller device. In certain variations, the substrate comprises a conductive material beneath the radiation sensitive positive resist material. Radiation or an electronic beam energy (e-beam) passes through one or more regions of the rigid patterned surface. In certain variations, radiation passes through one or more regions of the rigid patterned surface to the radiation curable photoresist material, so that one or more preselected regions of the positive resist material exposed to radiation or e-beam energy are capable of being removed by a developer and unexposed regions outside the preselected regions remain intact in the presence of the developer. Thus, the method further comprises exposing the substrate to the developer to remove the one or more preselected regions of the radiation-exposed sensitive positive resist material, so that the underlying conductive material defines the conductive micro-grating or nano-grating structure in the one or more preselected regions.

In yet other variations, methods for forming a conductive micro-grating or nano-grating may comprise passing a substrate having a radiation sensitive material disposed thereon, such as a curable photoresist material, under a rigid patterned surface of a roller device. Radiation or an electronic beam energy is directed or passed through one or more regions of the rigid patterned surface. In certain variations, radiation passes through one or more regions of the rigid patterned surface to the radiation curable photoresist material, so as to cure one or more preselected regions of the radiation curable photoresist material on the substrate. In one embodiment, radiation is generated from a radiation source disposed inside the roller device. In an alternative aspect, the radiation passing through one or more regions of the rigid patterned surface may be reflected by a reflector component disposed inside the roller device. The internal reflector component thus reflects radiation from an external source directed at the roller device up through the one or more regions of the rigid patterned surface. A metal or other conductive material may be applied as a layer to the major surface of the substrate over the regions of cured and uncured photoresist material. The method further comprises etching the substrate to remove uncured radiation curable photoresist material and the conductive material layer in regions outside the one or more preselected regions comprising cured photoresist material. The metal or other conductive material thus defines a micro-grating or nano-grating structure formed on the substrate.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIGS. 1(a)-(c): (a) shows a schematic of a first embodiment according to certain aspects of the present teachings for a roller photolithography device used to pattern micron-size line patterns continuously on a moving substrate; (b) shows a schematic of a second embodiment according to certain aspects of the present teachings for a roller lithography using phase mask to pattern submicron features on a conductive sheet continuously on flexible substrate; (c) shows additional processing to produce conductive material grid patterns on a large area substrate after processing via either the photolithography method in FIG. 1(a) or FIG. 1(b).

FIGS. 2(a)-(d) show a method for nanopatterning by phase shift lithography. FIG. 2(a) shows a schematic design for an embodiment of an apparatus for phase shift lithography having a roller phase shift mask that continuously passes over a substrate for patterning, a UV light source, a moving stage, and controllers. (b) shows a photo image of an experimental set up including a roll type phase shift mask like shown in the schematic of (a). (c)-(d) are SEM images representing the phase shift mold pattern itself (c) and a fabricated mesh pattern on a substrate after processing (d).

FIGS. 3(a)-(d): (a) a schematic illustration of an exposure procedure occurring between a phase shift mask surface of a roller and the substrate being patterned while radiation is generated internally within the roller. (b) a cross sectional SEM image of fabricated photoresist (PR) pattern by phase lithography according to the present teachings. (c)-(d) SEM images of large area patterns formed by phase lithography according to certain aspects of the present teachings.

FIGS. 4(a)-(e) show initial results obtained by a combination of roll to roll (R2R) phase shift lithography to pattern a photoresist grid pattern and plasma etching of Al film on a substrate by using the patterned resist mask. (a)-(d) show scanning electron micrographs of Al wire grid fabricated by roll to roll (R2R) phase lithography and Al dry etching at 10 µm, 30 µm, 50 µm, and 70 µm respectively. (e) shows measured optical transmittance of various examples made in accordance with principles of the present disclosure.

FIGS. 7(a)-(b) show calculated optimum period of a nanopatterned metal grating in a transparent metal electrode as a function of the sheet resistance of a PEDOT:PSS layer. (a) selection of a metal grating period and a PEDOT sheet resistance within the shaded region will lead to negligible loss of photocurrent. (b) current density-voltage (J-V) curves of devices made with transparent Cu mesh on PEDOT coated PET substrate (●) and ITO on PET substrate (■) under AM 1.5 G conditions. The inset shows a schematic of a fabricated device showing various layer structures.

FIGS. 8(a)-(b): (a) shows optical transmittance of an ITO electrode and transparent metal electrodes formed from copper with a period of 700 nm and line-width of 70 nm. (b) An average transmittance compared to sheet resistance of transparent metal electrodes with a line-width of 120 nm.

Figure 9C:
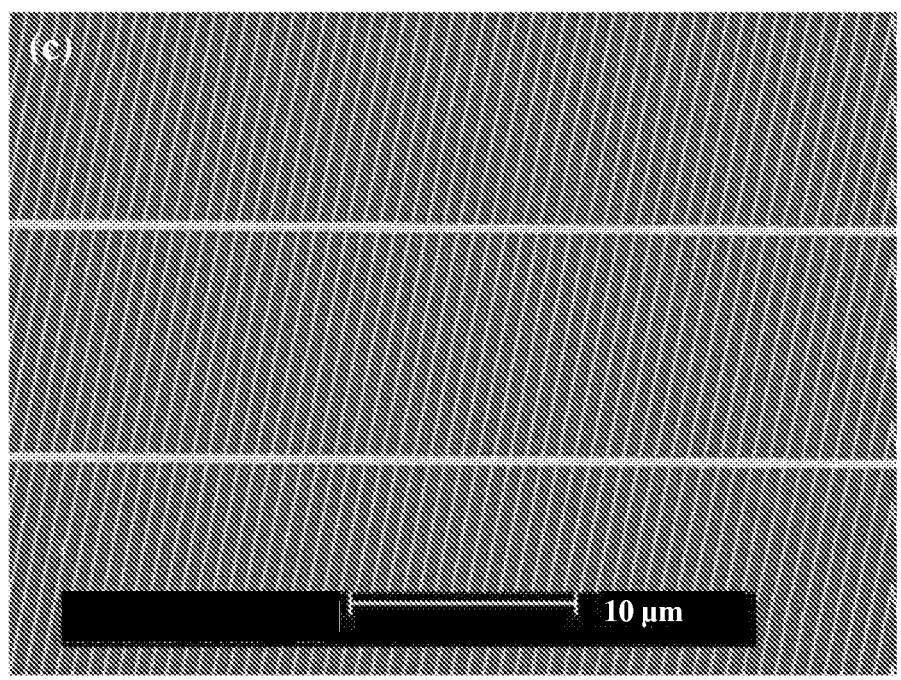

FIGS. 9(a)-(c): (a) is a normalized conductance versus inverse of a radius of curvature of a grating mesh comprising copper (Cu) wire (●) and the ITO electrode (■). The Cu mesh electrode on a poly(3,4-ethylenedioxythiophene) (PEDOT)-coated polyethylene terephthalate (PET) substrate demonstrates a superior flexibility and can be bent to about 3 mm curvature with no degradation of conductance. SEM images of the ITO (b) and Cu mesh electrode (c) after the bending test, respectively. In contrast to Cu mesh structure, the ITO severely cracks from the bending.

FIGS. 10(a)-(g): (a) a checkerboard phase mask design in (a) is used to fabricate a mesh or grating pattern by using phase lithography in accordance with certain aspects of the present disclosure. (b) an SEM image of a mesh pattern formed from phase lithography using the mask design of (a). Scale bar indicates 100 μm and 2 μm in inset, respectively. (c) Simulation data of light intensity of mask design (a). (d) Simulation data of mask pattern or design which has 300 nm gap between neighboring pattern structures. (e) a schematic illustration of a mask design for modified checkerboard pattern with 300 nm gap between dislocated structures. (f) SEM image of a molded design formed from a mask design like in (e). (g) is a magnified SEM image of (f).

FIGS. 11(a)-(d): (a) is an SEM image showing well connected Al mesh pattern with a period of 10 μm formed by phase lithography techniques according to certain aspects of the present teachings. (b) SEM image of 30 μm periodic Al mesh pattern formed by phase lithography techniques according to certain aspects of the present teachings. (c) a magnified image of a connected part between two rectangular units. (d) a photo image of large area (100 mm$^2$) transparent Al mesh electrode formed by phase lithography techniques according to certain variations of the present disclosure.

Figure 12:
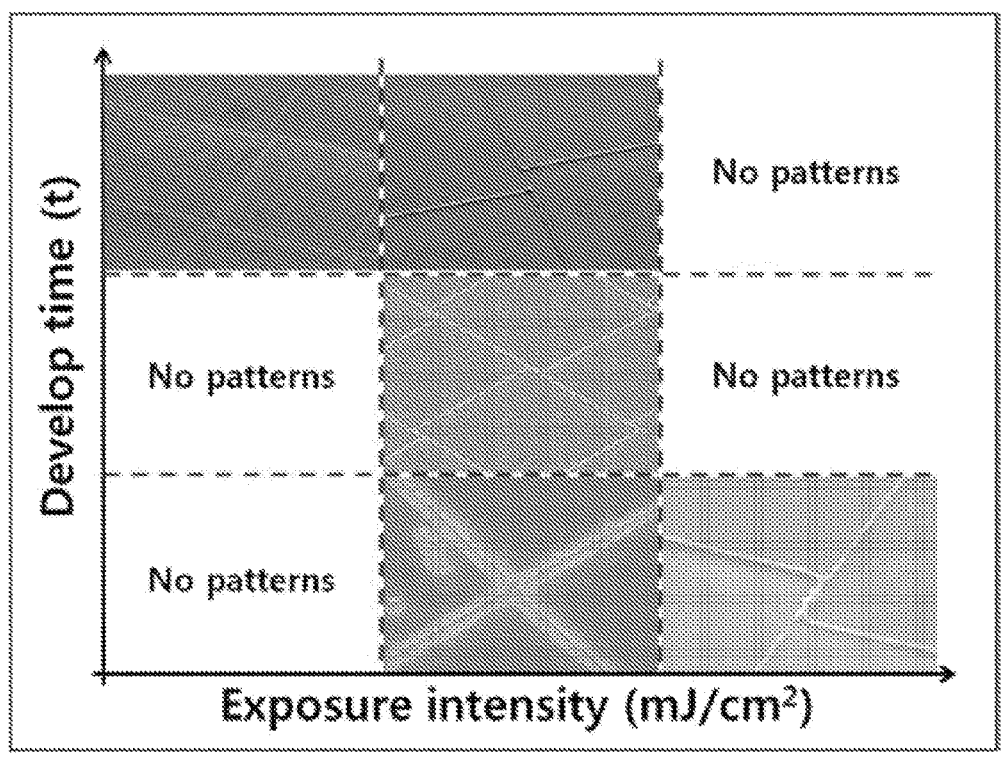

FIG. 12 is a diagram for a wide range of exposure intensity and develop times for phase lithography. The range of 50 to about 75 seconds for development time and 25 to about 45 mJ/cm$^2$ shows optimum condition for fabrication via phase lithography. Weak intensity led to reversed pattern with target pattern, too much exposure made patterns disappear. By increasing the develop time, an exposed sample is developed and erased sequentially from connected parts to center of squares.

FIGS. 13(a)-(b): (a) shows transmittance of various transparent conductive electrode (TCE) samples with three different thicknesses and two distinct periods. (b) a measured sheet resistance values for fabricated samples and calculated values (blue) for the same experimental samples.

FIGS. 14(a)-(c): (a) shows a schematic design for an embodiment of an apparatus for an optical lithography having a roller photomask that continuously passes over a substrate for patterning and has regions for transmitting UV radiation and regions comprising chromium that block transmission, a UV light source, a moving stage, and controllers. (b)-(d) are SEM images representing fabricated nano-structure mesh structures on a substrate formed from an optical phase mask nanolithography technique, like that shown in FIG. 14(a). FIG. 14(b) has a scale bar of 20 μm and FIG. 14(c) of 5 μm.

Corresponding reference numerals indicate corresponding parts throughout the several views of the drawings.

DETAILED DESCRIPTION

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. In addition, disclosure of ranges includes disclosure of all values and further divided ranges within the entire range, including endpoints given for the ranges. Example embodiments will now be described more fully with reference to the accompanying drawings.

In various aspects, the present disclosure pertains to apparatuses and methods related to a high throughput and high speed continuous patterning of micro-scale and/or nano-scale features (referred to herein as "nano-scale features" or "nano-patterning"). Thus, the disclosure provides methods of forming a structure or feature on a substrate surface that is on a micro-scale. In some aspects, the structure can be smaller than a microstructure, such as a nano-scale structure or feature. Thus, in certain variations, such micro-patterning or nano-patterning may be conducted using roll to roll and/or roll to substrate or plate patterning. As used herein, "micro-scale" refers to a structure having at least one dimension that is less than about 100 µm, optionally less than about 10 µm and in some aspects, less than about 1 µm. A "nano-scale" structure or feature has at least one dimension that is less than about 500 nm (0.5 µm), optionally less than about 100 nm (0.1 µm), optionally less than about 50 nm, and optionally less than about 10 nm. As used herein, while reference may be made to a nano-scale, nanostructures, nano-sized features and nano-patterning in preferred aspects, such principles are also applicable to formation of micro-scale structures and micro-features in alternative embodiments.

Accordingly, the present disclosure provides for methods of nano-patterning a substrate to form micro-scale and nano-scale features. In certain variations, a method for forming a transparent metal electrode or a polarizer by nanolithography is provided. A conductive grating structure can be formed, where the method comprises passing a substrate comprising a layer of conductive material having a radiation sensitive material disposed thereon, such as a curable photoresist material, under a rigid patterned surface of a roller device. The radiation is directed or passes through one or more regions of the rigid patterned surface to the radiation curable photoresist material, so as to cure one or more preselected regions of the radiation curable photoresist material on the substrate. In certain embodiments, radiation is generated from a radiation source disposed inside the roller device. In alternative embodiments, radiation is directed from an external radiation or light source disposed external to the roller device and is reflected by one or more reflector components disposed within the roller device, such as a mirror installed inside the roller device. In such an embodiment, an external source of radiation is directed at the roller device and thus radiation is reflected through one or more regions of the rigid patterned surface to the radiation curable photoresist material, so as to cure one or more preselected regions of the radiation curable photoresist material on the substrate.

The method further comprises removing, e.g., by etching, the substrate to remove uncured radiation curable photoresist material and the underlying conductive material in regions outside the one or more preselected regions comprising cured photoresist material. After removal of the uncured photoresist and underlying conductive material, the cured photoresist material is then removed from the one or more cured preselected regions, so that the underlying conductive material defines a conductive grating structure in these one or more preselected regions.

In certain variations, methods for nanopatterning by phase shift lithography are provided. In certain aspects, the nanopatterning occurs by phase shift lithography, which comprises passing a substantially cylindrical roller phase mask device over a substrate. By "substantially cylindrical" it is meant that the roller device may deviate from a true cylindrical shape on the outer peripheral regions and may have certain regions that are flattened, patterned by protrusions or cavities, or may have different shapes, but still has the capability of rolling and therefore being used as a roller device. In certain variations, the substantially cylindrical roller phase mask comprises an external patterned surface that passes over and in certain variations contacts the substrate. Such a technique is based on phase lithography, but instead of using a soft elastomeric stamp as in conventional phase lithography techniques, employs a substantially rigid cylindrical or roller phase mask to combine some of the most desirable aspects of photolithography, soft lithography, and continuous roll to roll/plate patterning technologies.

As discussed further below, the roller phase mask comprises an exposed patterned surface layer that has greater rigidity than conventional elastomeric phase masks, however, the roller may comprise internally disposed layers that are elastomeric and provide cushioning beneath the substantially rigid patterned surface layer. In a phase shift mask, transmission typically occurs by a phase shift through a semitransparent structure, such as a patterned surface of a phase mask that produces 180° phase shift in transmitted light. A phase mask is a transparent photomask with surface relief structures that produce optical phase shift. By "substantially rigid" it is meant that the material forming the external patterned surface layer is capable of being wrapped to form a circumferential surface about the roller, but has significant rigidity reflected by having an elastic modulus of greater than or equal to about 10 MPa, optionally greater than or equal to about 50 MPa; optionally greater than or equal to about 100 MPa; optionally greater than or equal to about 150 MPa; and in certain variations, greater than or equal to about 200 MPa. Thus, the polymer forming the substantially rigid surface layer may be inelastic and relatively rigid, expressed by having a hardness or elastic modulus of greater than or equal to 200 MPa to less than or equal to about 5 GPa, for example. Furthermore, in various aspects, at least a portion of the roller device defines a cavity or is hollow to permit a radiation source to be disposed therein. The rigid patterned surface of the cylindrical or roller phase mask may comprise a polymeric material that is transparent to the radiation. In other cases, the patterns that block the light can be made directly on a quartz or silica roller surface. Further, the substantially rigid patterned surface of the roller phase mask may comprise a one or more discrete regions comprising a material that prevents transmission of the radiation, such as a metal that prevents transmission of radiation there through.

In certain variations, the substrate to be patterned comprises a conductive material, such as a layer of conductive material. The substrate further comprises a radiation curable photoresist material disposed thereon. Next, a radiation source may be disposed inside the roller mask device generates electromagnetic radiation that passes through one or more regions of the rigid patterned surface of the roller device to the substrate (e.g., to the radiation curable photoresist material disposed on the substrate). Thus, the electromagnetic radiation that passes through the cylindrical phase mask or roller can cure one or more preselected regions of the radiation curable photoresist material on the substrate. In certain embodiments, the passing of the roller phase mask over the substrate and generating of the radiation occur concurrently to one another. Furthermore, the passing of the substantially rigid patterned surface of the roller phase mask over a substrate further optionally comprises contacting the rigid patterned surface of the roller phase mask with the radiation curable photoresist material disposed on the substrate.

The substrate can then be etched to remove uncured photoresist material and the underlying conductive material layer in regions outside the one or more preselected regions comprising cured photoresist material. After the uncured photoresist and conductive material beneath it are removed, the cured photoresist material is then removed from the one or more cured preselected regions, so that the underlying conductive material defines one or more conductive micro-scale or nano-scale features capable of use in a variety of applications, such as a metal or graphene grating for a transparent conductive electrode.

In other variations, methods for forming a conductive micro-scale or nano-scale grating structure by optical lithography are provided. Such methods may include passing a substrate having a radiation curable photoresist material disposed thereon under a rigid patterned surface of a roller photomask device. Like in the previous embodiments, the substrate may have a layer of conductive material over which the curable photoresist material is applied. The rigid patterned surface thus forms a photomask for optical lithography. Thus, in certain variations, radiation is generated from a radiation source disposed inside the roller photomask device that passes through one or more regions of the rigid patterned surface to the radiation curable photoresist material, so as to cure one or more preselected regions of the radiation curable photoresist material on the substrate. The photomask is formed in a similar manner to the phase mask described above, but instead is a binary mask, where certain regions of the photomask permit radiation to pass through, while other regions are opaque or block transmission. For example, discrete regions of a non-transmissive or opaque material, such as chromium, can be disposed on the rigid patterned surface to form the pattern of the phase mask. Thus, the substrate having the radiation curable photoresist material is patterned based on transmission of radiation through the pattern formed on the photomask.

For these methods of optical photolithography, much like the embodiment with the phase mask, the uncured radiation curable photoresist material may be removed from regions outside the one or more preselected regions. Thus, the substrate can then be etched to remove uncured radiation curable photoresist material and the underlying conductive material in regions outside the one or more preselected regions comprising cured photoresist material, similar to the optical shift phase mask embodiment discussed above. Then, a second removal step to remove the cured photoresist material from the cured preselected regions is conducted, so that the underlying conductive material defines the conductive micro-scale or nano-scale grating structure.

Thus, the present teachings provide methods of nanopatterning of substrates by a continuous near-field optical nanolithography method by using a roll-type phase-shift mask or alternatively a photomask. In certain methods, a near-field optical nanolithography technique uses a roll-type phase-shift mask comprising a rigid patterned externally exposed surface that transfers a pattern to an underlying substrate. Sub-wavelength resolution is achieved using near-field exposure of photoresist material through the cylindrical rigid phase-mask, allowing dynamic and high throughput continuous patterning. In certain variations, the present disclosure provides methods of fabricating nanostructures, such as transparent conductive electrode or polarizer nanogratings, by roll type phase-shift lithography. Phase lithography provides sub-wavelength scale line patterns and use of the inventive substantially rigid roller device phase mask also allows for dynamic continuous processing. In other methods, a near-field optical nanolithography technique uses a roll-type photomask comprising a rigid patterned externally exposed surface that transfers a pattern to an underlying substrate, which likewise can form sub-wavelength micro-features or nano-features.

Accordingly, the present teachings provide high-throughput continuous patterning or imprinting of microstructural features on a major surface of a substrate, thus providing a commercially viable and scalable method of producing micro-scale or nano-scale devices, such as nano-grating structures for transparent conductive electrodes or optical polarizers. The disclosure provides methods of forming micro-scale or nano-scale structures within or on a major surface of a substrate, where the micro-scale structure has an elongate axis, a height, and a width between features. A major elongate axis refers to a shape having a prominent elongate dimension. In certain aspects, the nano-features or micro-features of the present disclosure have desirable aspect ratios with regard to height and width dimensions of each respective structure. For example, an aspect ratio is optionally defined as AR=H/W where H and W are the height and the width of the nano-feature or micro-feature. Desirably, the present teachings enable high throughput production of micro-features or nano-features having an AR of greater than about 1, optionally greater than about 3, optionally greater than about 10. In this manner, the present teachings provide the ability to provide desirably high aspect ratio structures with a desirably short period or physical distance/interval between adjacent structures.

In certain variations, such techniques are used to fabricate transparent electrodes or polarizers that comprise conductive/metallic wire grids or grating structures by using the inventive roller-based optical lithography methods. By "grating structure" it is meant that a highly conductive material, like metal or graphene, forms a structure that comprises one or more openings there through to permit certain wavelength(s) of light to pass through. For example, in certain preferred aspects, a grating structure may comprise a plurality of conductive material rows or discrete regions spaced apart, but substantially parallel to one another. The spacing between adjacent rows defines a plurality of openings through which certain wavelengths of light may pass. The grating may also comprise a second plurality of conductive rows having a distinct orientation from the first plurality of rows that are likewise spaced apart, but substantially parallel to one another. The first and second plurality of rows may intersect or contact one another at one or more locations to form a grid or mesh structure. It should be noted that in preferred aspects, the grating comprises at least two rows to form at least two openings, but that the number of rows and layers of distinct grating structures are not limited to only two, but rather may comprise multiple different designs and layers. Further, as described below, while the adjacent conductive rows or other regions of the plurality are preferably distanced at a sub-wavelength distance from one another (a distance of less than the target wavelength or range of wavelengths), each respective pair of rows may define a distinct distance for each opening (or slit diameter) there between and thus will permit different wavelengths of light to travel there through. Thus, a grating structure where the conductive rows optionally comprise a conductive metal or graphene may be employed as a transparent conductive electrode and/or as an optical polarizer, by way of non-limiting example.

The near-field optical nanolithography methods according to certain aspects of the present teachings can be scaled for continuous and high throughput nanomanufacturing processes. In contrast to previous approaches that used soft elastomers like polydimethyl siloxane (PDMS) as the external or only surface of a phase mask, in certain preferred aspects, the roller phase mask (or at least portions of the external surface of the roller phase mask) of the present technology comprises a relatively rigid polymer, which helps to maintain pattern height on the phase mask during the process. The maintenance of pattern height on a phase mask is believed to be a very important parameter in a phase lithography process. Thus, the processes of the present technology have increased process reproducibility, which is known to be a limiting factor for previously known methods, and can be scaled for continuous and high throughput nanomanufacturing process. With such techniques, various shaped large area patterns, including circular or bent patterns and straight-line patterns, can be successfully fabricated. Conductive wire grid grating structures form transparent conductors readily made by using this lithographic technique combined with a dry etching process. For metallic transparent conductors, in certain embodiments, the metal on the substrate comprises aluminum (Al) providing low cost conductors having ease of fabrication. For example, in certain variations, a transparent conductor can be designed with the inventive cylindrical phase-shift lithography methods to form a pattern on large area substrate. Thus, the present methods are a practical solution for forming electrodes or polarizers for display devices and organic solar cells, by way of non-limiting example.

For example, in certain embodiments, a method is provided for forming a micro-grating or nano-grating structure, for example for a transparent conductive electrode, by nanolithography that comprises passing a substrate comprising a conductive material layer having a photosensitive material, such as a radiation curable photoresist material, disposed thereon under a rigid patterned surface of a roller device phase mask. Suitable materials for forming the flexible, but substantially rigid patterned external surface layer of the roller device through which radiation can pass to the substrate include polyurethaneacrylate (PUA), such as MINS-311RM, sold by Minuta Technology Co., Ltd.

For the radiation curable photoresist material disposed on the substrate to be patterned by the roller device, any conventional photosensitive material, such as a photoresist material, that cures or is otherwise reactive to exposure to radiation or e-beam energy is contemplated, including negative and positive photoresist materials. With positive resist materials, the areas exposed to radiation or e-beam energy at certain levels become soluble in developer, while with negative resists the exposed areas are cross-linked and become insoluble. Suitable photosensitive photoresist materials include by way of non-limiting example all g-line and i-line photoresists (responsive to spectral lines at about 436 nm ("g-line") and 365 nm ("i-line"), as well as resists for shorter wavelength exposure light sources. For example, Microposit™ S1800 series commercially available from Shipley, especially Microposit™ S1805 are particularly suitable positive photoresist materials.

Other radiation curable liquid materials may comprise epoxysilicone, epoxy precursor (SU-8), or thermal or photocurable silsesquioxane. In certain variations, a particularly suitable curable liquid material comprises an ultraviolet light-curable epoxy-silsesquioxane (SSQ). SSQ polymers, poly(methyl-co-3-glycidoxypropyl) silsesquioxanes ($T^{Me}$-$T^{Ep}$), poly(phenyl-co-3-glycidoxypropyl) silsesquioxanes ($T^{Ph}T^{Ep}$), and poly(phenyl-co-3-glycidoxypropyl-coperfluorooctyl) silsesquioxanes ($T_{Ph}T^{Ep}T^{Fluo}$), are precisely designed and synthesized by incorporating the necessary functional groups onto the SSQ backbone. Such materials are described in Pina-Hernandez et al., "High-Resolution Functional Epoxysilsesquioxane-Based Patterning Layers for Large-Area Nanoimprinting," ACS Nano, vol. 4, no. 8, 2010, pp. 4776-4784, incorporated herein by reference in its entirety. One particularly suitable curable liquid material comprises an epoxy-SSQ (TPhenyl$_{0.4}$Q$_{0.1}$TEpoxy$_{0.5}$) mixed with 3 wt. % photoacid generator (UV-9820, Dow Corning Corp.) and diluted with propylene glycol monomethyl ether acetate (PGMEA) to make a SSQ resist solution containing 10-20 wt. % SSQ.

Other suitable liquid curable materials are described in Pina-Hernandez et al., "High-Throughput and Etch-Selective Nanoimprinting and Stamping Based on Fast-Thermal-Curing Poly(dimethylsiloxane)s," Adv. Mater. Comm., DOI: 10.1002/adma.200601905 (2007), pp. 1-7, incorporated herein by reference in its entirety. Yet other suitable liquid curable materials include those described in Cheng et al., "Room-Temperature, Low-Pressure, Nano-imprinting Based on Cationic Photopolymerization of Novel Epoxysilicone Monomers," Adv. Mater. 17 (11) (2005), pp. 1419-1424, incorporated herein by reference in its entirety. Yet other curable photosensitive polymeric materials, especially photoresist materials, known or to be discovered in the art are likewise contemplated. The liquid photosensitive curable material may be applied to the major surface of the substrate having the conductive material previously applied (prior to being exposed to the phase mask roller) by a process selected from spin casting, spin coating, ink jetting, spraying, and/or by gravure application methods.

The highly conductive materials disposed on the substrate (below the radiation curable photoresist material) optionally comprise graphene, aluminum (Al), gold (Au), copper (Cu), silver (Ag), combinations and alloys thereof, but any other metals or conductive materials can be used for this purpose as well. The metals or graphene may be deposited in any conventional manner. For example, metal deposition onto a substrate can be conducted by physical vapor deposition (PVD), chemical vapor deposition (CVD), vacuum metallization, evaporation or sputtering, and other conventional techniques for forming layers of metal on a substrate. Any substrate can be selected known to those of skill in the art, such as a glass based or polymeric substrate. For example, a suitable substrate optionally comprises silicon dioxide, silicon, any metallic substrate, such as a thin metal plate or a metal foil, or metalized plastic, polymers, like polyethylene terephthalate (PET), polyethylene naphthalate or (poly (ethylene 2,6-naphthalate) (PEN), siloxane, polycarbonate and the like, by way of non-limiting example are contemplated.

As noted above, the roller device may be formed from a hollow cylinder core and may be formed from quartz or other materials transparent to the radiation emitted from inside the cylinder through the patterned external surface. In alternative aspects, the core of the roller phase mask may have one or more slits or apertures formed to provide greater contact between the external layers of the phase mask and the underlying substrate or to provide better transmission of radiation to the underlying substrate.

A radiation source or electron beam generator may be disposed inside the roller device (or directed from an external source) to direct and/or generate radiation that passes through one or more regions of the rigid patterned surface and passes to the radiation curable photoresist material, so as to cure one or more preselected regions of the radiation curable photoresist material on the substrate. The radiation may be selected from the group consisting of: actinic radiation, like ultraviolet radiation, electron beam (e-beam), and combinations thereof. As noted above, in certain alternative embodiments, one or more reflector components may be disposed within the roller device, so that radiation may be directed towards the roller device and reflected by the reflector component through the patterned surface to form the pattern on substrate.

Phase lithography typically produces closed looped line pattern along the edge of mask structure, so in accordance with certain aspects of the present teachings, a particular mask design is created (a patterned surface of the phase mask) to create a well-connected and reproducible mesh pattern, as certain earlier technologies did not produce well-connected and reproducible grid patterns suitable for use as a grating for an electrode or an optical filter. Therefore, a particular mask design has been designed to make a desirable patterned surface of a polymeric phase mask and it produces well-connected mesh patterns with various preselected periods. Fabricated transparent metal electrodes with 10 μm period show about 85% in transmittance and 57 Ohm-square ($\Omega/\square$) in sheet resistance and a sample with 30 μm period represents values of 95% transmittance and 160$\Omega/\square$. A reduced sheet resistance can be obtained by increasing the metal line thickness, while maintaining the lateral dimensions.

After exposure to the radiation, the substrate is then optionally etched to remove uncured radiation curable photoresist material and the underlying conductive material in regions outside the one or more preselected regions comprising cured photoresist material. The etching may include a conventional plasma etching or a wet etching process, including those various etching processes known in the microelectronic fabrication arts. Next, the cured photoresist material is removed from the one or more cured preselected regions, so that the underlying conductive material defines one or more metal micro-scale or nano-scale features capable of use as a conductive grating for a transparent conductive electrode.

In other variations, methods are provided for forming a conductive micro-grating or nano-grating, where the conductive material is omitted from the substrate during processing with the roller device. Instead, a metal or conductive material is applied after forming a pattern in the radiation sensitive cured materials on the substrate. In one such embodiment, the method comprises passing a substrate having a radiation sensitive material disposed thereon (without any underlying conductive material), such as a curable photoresist material, under a rigid patterned surface of a roller device. Such a roller device may comprise a photomask or a phase shift mask, as discussed in the embodiments described above.

Radiation or an electronic beam energy is directed or passes through one or more regions of the rigid patterned surface. In certain variations, radiation passes through one or more regions of the rigid patterned surface to the radiation curable photoresist material, so as to cure one or more preselected regions of the radiation curable photoresist material on the substrate. In one embodiment, radiation is generated from a radiation source disposed inside the roller device. In an alternative aspect, the radiation passing through one or more regions of the rigid patterned surface may be reflected by a reflector component disposed inside the roller device. The internal reflector component thus reflects radiation from an external source directed at the roller device up through the one or more regions of the rigid patterned surface.

A metal or other conductive material is then applied over the substrate, including over the one or more preselected regions of the cured photoresist material. Application of such conductive materials, like conductive metals or graphene, can be by any conventional manner. For example, metal deposition onto a substrate can be conducted by physical vapor deposition (PVD), chemical vapor deposition (CVD), vacuum metallization, evaporation or sputtering, and the like. Such metal application may involve directional application of the conductive material to the cured photoresist material.

The method further comprises etching the substrate to remove uncured radiation curable photoresist material along with the conductive material layer on the regions outside the one or more preselected regions comprising cured photoresist material (in other words to remove the conductive material in the regions corresponding to the uncured photoresist material). The conductive material thus defines a conductive grating structure on the substrate.

In yet other variations, the present disclosure provides for methods of micro-patterning or nano-patterning a substrate that comprises a positive photoresist radiation sensitive material disposed thereon. The substrate is passed under a rigid patterned surface of a roller device, similar to those embodiments described above (either a photo mask or a phase shift mask). Radiation or an electronic beam energy (e-beam) passes through one or more regions of the rigid patterned surface of the roller device. In certain variations, radiation passes through one or more regions of the rigid patterned surface to the radiation sensitive positive resist material, so that one or more preselected regions of the positive resist material exposed to radiation or e-beam energy are capable of being removed by a developer, while unexposed regions outside the preselected regions remain intact in the presence of (during exposure to) the developer. Thus, the method comprises exposing the substrate to a developer to remove the exposed regions of the positive resist material to form a pattern on the surface of the substrate, while the regions that were not exposed to radiation remain intact. In certain aspects, the method may further comprise applying a conductive material to the surface prior to the exposure to developer, so that the exposure to the developer removes conductive material as well as the underlying radiation-exposed positive resist material. In other embodiments, the substrate may comprise the conductive material disposed below the positive resist material, so that when the substrate is passed under the roller device and exposed to radiation, followed by exposure to developer, the underlying conductive material remains intact upon removal of the radiation-exposed positive resist material. From any of these methods, a patterned conductive material defining a conductive grating structure is formed. Such a method is particularly useful in certain variations for roll-to-roll photolithography, as the resist line patterns can be washed away by solvent or developer, rather than requiring a plasma dry etching.

A transparent metal electrode in the form of a periodic nano-scale metal wire grid or grating fabricated by near-field phase optical nanolithography methods has high optical transparency and good electrical conductivity. Such properties can be adjusted independently by changing the conductive material line widths and thicknesses in the metal grid structure by adjusting the rigid patterned surface of the roller phase mask. In addition, such a transparent metal electrode can be fabricated by a roll-to-roll process for low cost and scalable manufacturing. Such transparent conductive electrodes (TCEs) having metallic nano-structures can desirably replace conventional ITO electrodes, due to superior properties including high optical transparency, good electrical conductivity and mechanical flexibility, and the versatility that these properties can be adjusted independently by changing the line width and thickness of the metal grid structure of the electrode during formation. Furthermore, such metallic nano-structure TCEs have unique optical properties due to the excitation of surface plasmon resonance (SPR) by the metallic nano-gratings to enhance the light absorption of organic semiconductors that results in enhanced power conversion efficiency over comparative ITO electrode devices.

According to certain aspects of the present teachings, a resonator or other filter structure for an optical spectrum filtering device can be fabricated from the near-field optical phase nanolithography methods according to the present teachings. The resonator structure comprises an electrically conductive grating structure and a dielectric material. The dielectric material may be applied after forming the resonator structure. The electrically conductive grating structure comprises at least two openings capable of transmitting a portion of an electromagnetic spectrum to generate a filtered output having a predetermined range of wavelengths.

Figure 5:
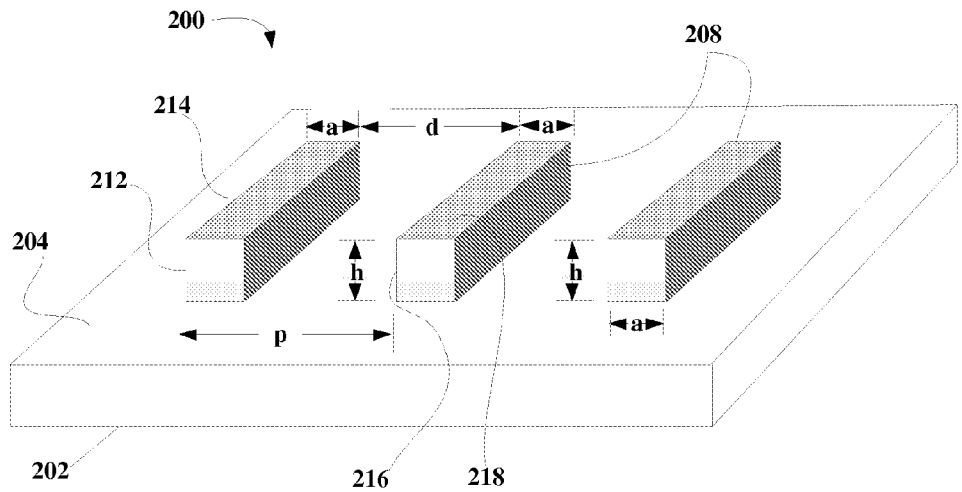
FIG. 5 is a schematic of a thin metal grating on a substrate used to create a formed via the methods of phase lithography of certain principles of the present disclosure.
Figure 6:
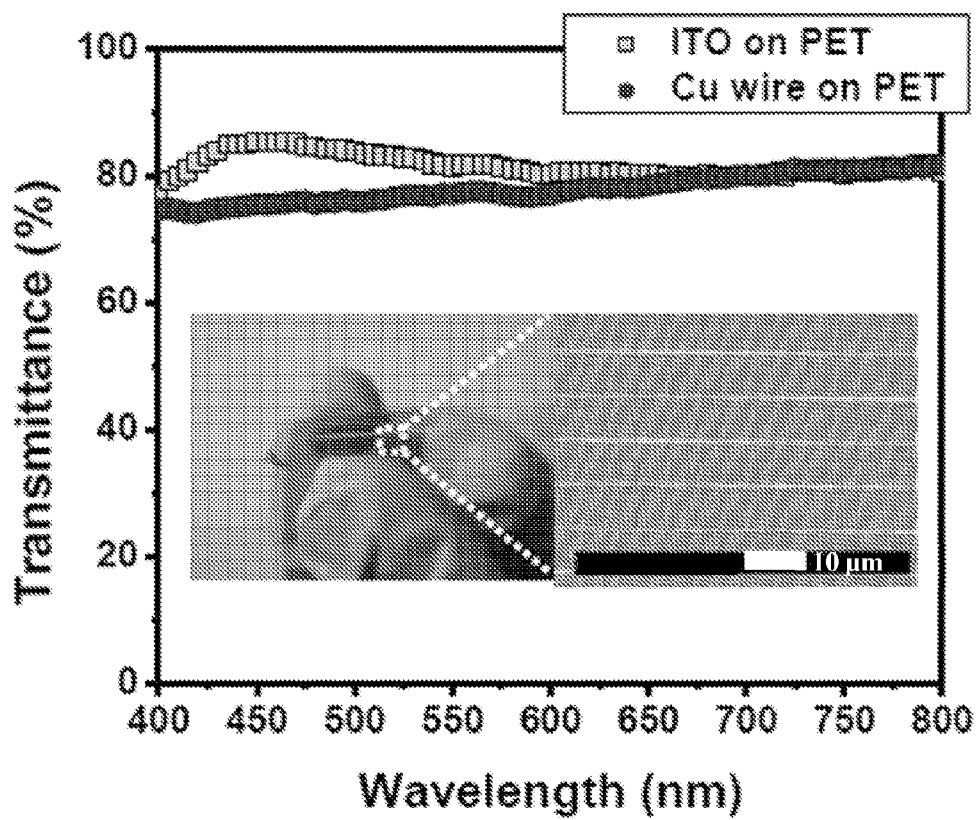
FIG. 6 shows transmission spectra of an ITO electrode and Cu wire grating mesh electrode on a PET substrate. An inset shows a photograph and SEM image of a high transparency Cu mesh electrode, with a line width of 70 nm and a period of 700 nm.

In certain aspects, a first grating structure (e.g., grid or mesh pattern) is formed on a major surface of the substrate via the phase lithography of the present disclosure. In one example, such as that shown in FIG. 5, a grating structure pattern 200 is formed over a substrate 202 having a major surface 204. The grating pattern may be formed of a conductive material, such as a thin metallic film. A plurality of substantially parallel rows 208 of such thin film conductive materials are formed on major surface 204. Furthermore, as discussed previously above, while not shown in FIG. 5, in certain preferred aspects, the grating structure further comprises one or more additional rows that intersect with rows 208 to form a grid or mesh pattern. The plurality of rows 208 in the grating pattern 200 optionally comprises an electrically conductive metal, such as gold or aluminum or other highly conductive materials, like graphene. In certain variations, aluminum or graphene are preferred electrically conductive materials for rows 208.

The grid or grating pattern 200 of metal rows formed on substrate 202 defines a period "p" (a distance defined from a first side 212 of a first row 214 to a first side 216 of a second adjacent row 218). A distance "d" between adjacent rows 208 is considered an opening (or aperture or slit). It should be noted that distance "d" may vary through the grating pattern 200 where d is represented by d=p−a. A metal row 208 has a height "h" and a width of each metal row 208 is "a." A duty cycle is defined by f=a/p. Periodicity refers to at least one period (p) between a pair of rows in the grating pattern, but where there are more than two openings typically to a repeating period (p) in the grating pattern. In one exemplary embodiment, the period (p) between rows 208 is about 700 nm, the width (a) of each row 208 is about 70 nm, and the height (h) of each metal row 208 is about 40 nm. Thus, a high transparency resonator structure, for example, can be designed by adjusting metal row width (a) and period (p) so that different wavelengths of light can be transmitted through openings (d). High conductance can likewise be achieved by adjusting the thickness (h) of the film of metal material forming rows 208. Such a grating pattern 200 provides a highly flexible design that can be readily tailored for different performance criteria.

The resonator structure can thus generate a filtered output having a predetermined range of wavelengths. In accordance with certain principles of the present teachings, a periodicity of the electrically conductive grating structure relates to the predetermined range of wavelength(s) that is transmitted. For example, in certain embodiments, the predetermined range of wavelengths of the filtered output is in the visible light range and has a color selected from the group consisting of: cyan, yellow, magenta, red, green, blue, and combinations thereof.

In various aspects, the present disclosure provides methods of forming various micro-structural features with various sizes, orientations, shapes, and configurations, especially grating structures that can be employed as resonator structures. In various aspects, the methods of the disclosure can be used to form wire grating resonators, electrodes, and/or polarizers, having at least one micro-scale and/or nano-scale feature (such as nano-grating that defines a multi-layer grating structure). Such grating nano-structures can have a variety of different shapes tailored to the end application; by way of example; a suitable wire grid polarizer has a period (i.e., interval/distance between a first feature and a second feature, see FIG. 5, for example) of less than about 1 µm suitable for polarizing and/or filtering electromagnetic energy waves in the visible (wavelength ranging from about 400 nm to about 800 nm) to IR (wavelengths ranging from about 0.75 µm to about 1 mm, including near-IR at about 1 µm to about 10 µm). Subwavelength grating structures are particularly desirable for plasmonic resonator devices, which means that one or more of the grating dimensions is smaller than a wavelength or range of wavelengths that are filtered by the device (e.g., a sub-wavelength grating means a grating structure for visible light having one or more dimensions that are less than a wavelength of 0.7 µm, preferably less than about 200 nm). Wire grid or grating structures according to the present teachings in the form of sub-wavelength metallic gratings are an attractive alternative to conventional polarizer filters, because they provide a high extinction ratio between the transmitted transverse magnetic (TM) polarized light and the reflected transverse electric (TE) polarized light over a wide wavelength range.

A spectrum filter can be obtained by fabricating a sub-wavelength metallic grating on top of a set of dielectric layers, as described in Kaplan et al, "High Efficiency Resonance-Based Color Filters with Tunable Transmission Bandwidth Fabricated Using Nanoimprint Lithography," *Appl. Phys. Lett.* 99, 143111, 2011, incorporated herein by reference. In certain aspects, the filtering occurs at least in part via an optical resonance process. A display device may comprise a display pixel that comprises a plasmonic resonator structure for color filtering via optical resonance. The plasmonic resonator structure comprises an electrically conductive grating structure and an active material, such as a photoactive material or a dielectric material. The electrically conductive grating structure comprises at least two openings capable of transmitting a portion of an electromagnetic spectrum generated by the display device. The electromagnetic waves can transmit through the two or more openings to generate a filtered and polarized output having a predetermined range of wavelengths via optical resonance. In certain variations, such a display device is a liquid crystal display (LCD) device. The resonator structure can serve as a transparent conductive electrode and a polarizer in a pixel for such an LCD display.

In certain variations, a transparent electrode in the form of metal grid can be used to shield electromagnetic waves in a first range of wavelengths, while transmitting electromagnetic waves in a second distinct range of wavelengths. Such a structure is transparent to short wavelengths of electromagnetic radiation (e.g., visible light); but can block longer wavelengths of EM radiation. For example, the metal grid can shield microwave and/or THz waves, while permitting visible light to pass through the structure. In such embodiments, a metal line width and the spacing between lines does not need to be relatively small, for example, a half micron (0.5 µm) line width and 5 mm spacing between lines can be used in such a grid structure, although dimensions and spacing can vary depending upon the EM wavelengths to be shielded, as recognized by those of skill in the art.

Figure 1:
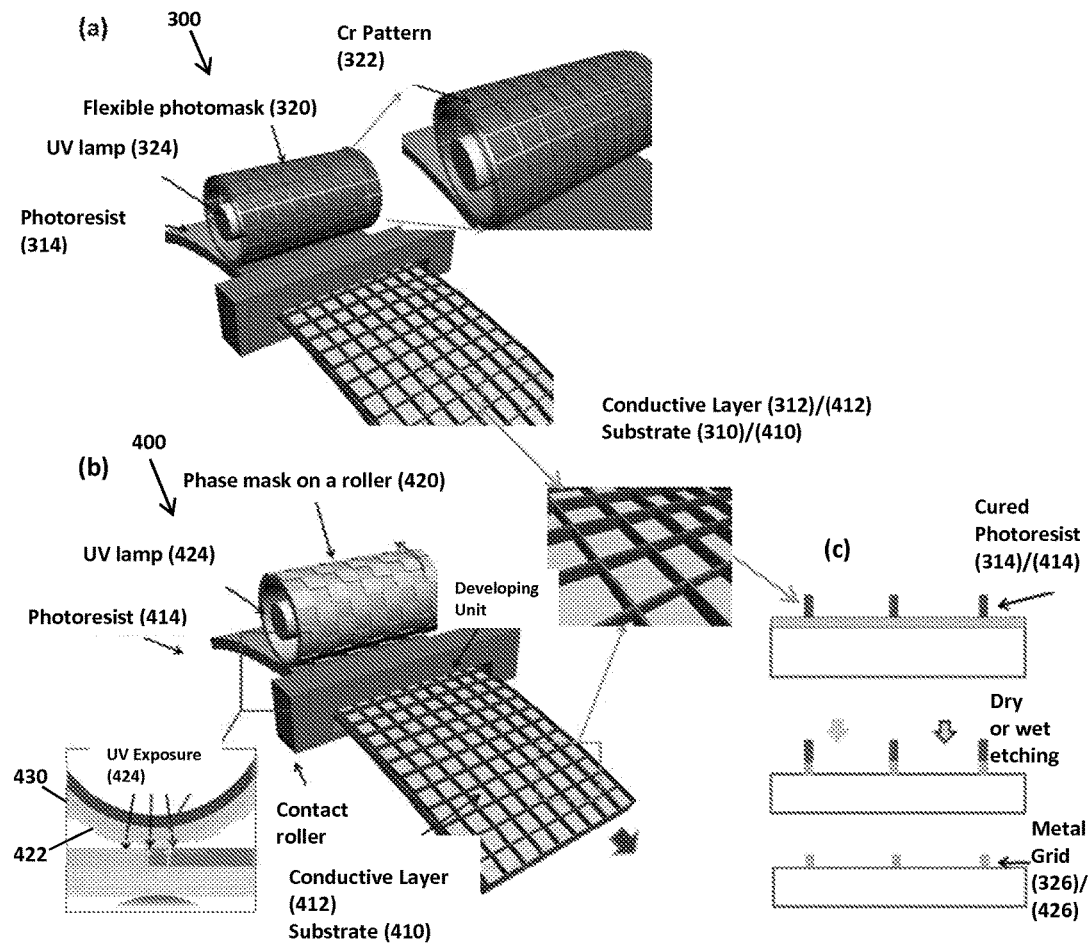

With reference to FIGS. 1(a) and 14(a), a schematic of one embodiment of a roller photolithography method is shown for patterning micron-size line patterns continuously on a moving substrate. The first technique is a roll-to-roll contact photolithography (r2rCP) technology 300 that patterns photoresist grid lines in a continuous process. A substrate 310 has a major surface having a conductive material layer 312 disposed thereon. Over the conductive material layer 312 is disposed a photoresist material 314. The substrate 310 having the photoresist material 314 passes beneath a roller photomask 320. The roller photomask 320 is flexible and comprises a patterned surface 322. The patterned surface 322 comprises a plurality of regions comprising a material like chromium (Cr) that is opaque to transmission of certain wavelengths of radiation. Thus, only certain regions of the patterned surface 322 between the opaque non-transmissive regions are transmissive to radiation or e-beam energy. The roller photomask 320 further comprises an internally disposed source of radiation, namely an ultraviolet radiation lamp 324. As noted above, in alternative embodiments, such a source of energy may instead be an electron beam generator, if the photosensitive material 314 is reactive to e-beam energy. Also, such a radiation generator may be a reflector component disposed within the roller device. As the substrate 310 having the photoresist 314 passes beneath the roller photomask 320, slight contact of the photomask patterned surface 322 with the substrate 310 is established, while UV radiation is emitted through transmissive portions of the photomask 320 to cure portions of the photoresist 314. Afterwards, the conductive material 312 on the surface of the substrate 310 in regions other than those having the cured photoresist 314 can be removed by any conventional etching process known in the art. Then the cured photoresist 314 is removed (see process shown in FIG. 1(c)) so as to form a conductive material grid or grating pattern.

Because the process shown in FIGS. 1(a) and 14(a) does not involve imprinting of resist material and a demolding process, a much higher throughput than a conventional R2R microimprint or nanoimprint process is possible. Further, such a process can avoid defect generation often found in conventional photolithography and nanoimprinting processes, as it only involves gentle contact of the patterned surface of the mask to the resist material disposed on the substrate. Resolution of 0.5 to 2 µm (micron) can be achieved as in a typical contact lithography by using 365 nm UV diode source. For example, as shown in FIGS. 14(b)-(c), line width patterns produced by this technique are on the order of about 880 nm. Smaller line widths can be produced by using shorter wavelength radiations. This technique is used produce a resist grid pattern on an Al-coated plastic or glass substrate; then a dry etching (or well-controlled wet etching) process is used to etch the Al film to wire grid patterns 326. Finally, the resist grid mask is removed by solvent (FIG. 1(c)).

Figure 2:
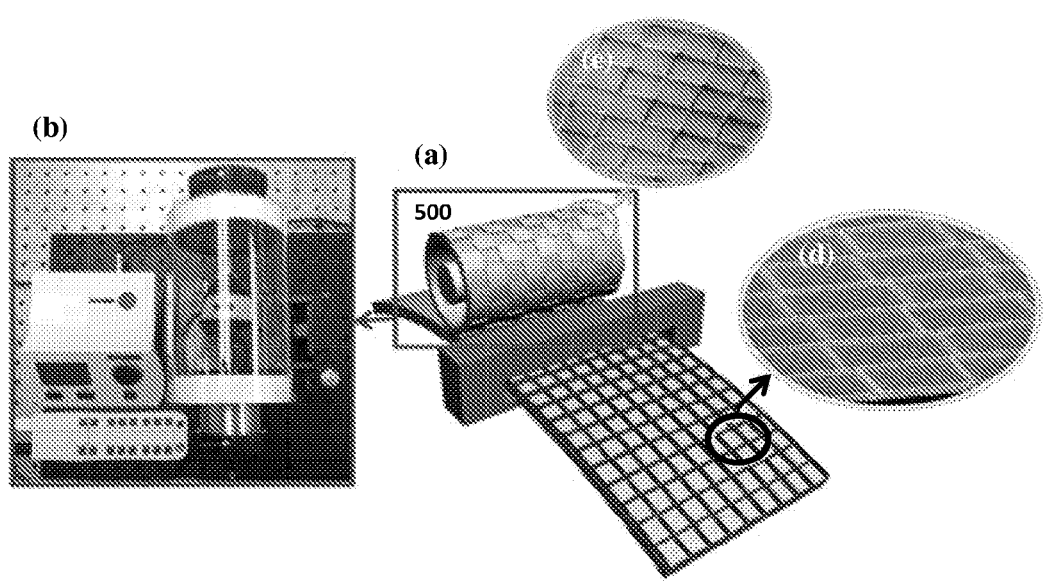

With reference to FIGS. 1(b) and 2(a), a second embodiment of a roller photolithography method 400 is shown for patterning line patterns continuously on a moving substrate 410. In such variations, a grid line width below 1 micrometer (1 µm) and approaching a few hundreds nanometers (nm) can be made, which involves a roller photolithography technique that uses an elastomeric phase mask 420 to produce sub-wavelength features used on a curable resist layer 414 cast on the substrate 410. This technique can be used in conjunction with a roll-to-roll process to provide a photolithography technology that patterns photoresist grid lines in a continuous process. Thus, the substrate 410 has a major surface comprising a conductive material layer 412 having the photoresist material 414 disposed thereon. The substrate 410 having the photoresist material passes beneath a substantially cylindrical roller phase mask 420. As discussed above, the phase mask 420 is a transparent photomask with surface relief structures to produce optical phase shift. The roller phase mask 420, which may comprise an elastomeric material as an internal cushion layer 430, however comprises a rigid patterned external surface 422 that passes by the substrate 410 having the photoresist 414. When the height of the protrusion features of the patterned surface 422 of the phase mask 420 is chosen to be half of the wavelength in the dielectric, the boundary of the protrusions will create a zero optical field as it is the transition region between positive and negative field (FIG. 1(b)).

The roller phase mask 420 further comprises an internally disposed source of radiation, namely an ultraviolet radiation lamp 424. As the substrate 410 having the photoresist 414 passes beneath the roller phase mask 420, slight contact of the photomask patterned surface 422 with the substrate 410 can optionally be established, while UV radiation is emitted through portions of the phase mask 420. Afterwards, the conductive material 412 on the surface of the substrate 410 in regions other than those having the cured photoresist 414 can be removed by any conventional etching process known in the art. Then the photoresist 414 is removed (see process shown in FIG. 1(c)) so as to form a conductive material grid or grating pattern 426. Such new techniques not only offer fast patterning speed for the moving flexible substrate, but also provide much gentler contact between the underlying substrate surface and the roller mask surface and thereby ensure the mechanical integrity of the substrates, even those substrates containing prefabricated functional elements.

FIGS. 2(a)-(d) likewise show a schematic diagram of the experimental set up for roll type phase shift lithography in accordance with certain aspects of the present teachings. FIG. 2(a) is a schematic diagram of the apparatus 500 for phase lithography employing a roller phase mask. FIG. 2(b) is a photograph showing an experimental set-up of such a device. The equipment includes a roll type phase mask, an xyz-stage, a substrate moving unit, and a UV exposing unit. While it is appreciated that coating of photoresist (PR) onto the substrate and developing may be automatically processed by conventional processing modules, in the experiments conducted, the PR coating and developing process are performed manually. For a roll type phase mask 510, as shown in greater detail in FIG. 3(a), a 90 mm diameter hollow quartz cylinder 512 is used as a core of the roller device. It should be noted that such a cylinder 512 is merely exemplary and other diameters and materials are contemplated. Collimated light from UV or other radiation source is preferred in these processes. Notably, the quartz cylinder 512 has an optional slit or aperture 514 formed therein to prevent radiation from exposing other parts of a photoresist 520 on a substrate 522 not already in contact with the phase mask or photomask 510 on the roller surface 524. A low elastic modulus layer of elastomeric material, like polydimethyl siloxane (PDMS), can be wrapped as a cushion layer 526 around the outer circumference of the quartz cylinder 512 for conformal contact between the mask 510 and PR 520 coated substrate 522. While PDMS can be a phase mask 510 itself, it could potentially be deformed by vertically applied force for conformal contact. Because pattern height is quite important in phase lithography, a phase mask 510 made with low elastic modulus material is not believed to be capable of producing adequate results in a roll type continuous system. To prevent deformation of the phase mask 510, a more rigid layer, such as a polymeric mold layer comprising polyurethaneacrylate ((PUA) (MINS-311RM), Minuta Tech.) is used to formulate phase mask patterning surface 524 on the external circumferential surface of the roller device 500.

To form the phase mask rigid patterned external layer 524, a small amount (about 0.1 to about 0.5 mL) of a UV curable PUA prepolymer is drop-dispensed on silicon master and a supporting PET film is carefully placed on top of the surface to make conformal contact. To cure, the film mold is exposed to UV (about 250 to about 400 nm) for 10 seconds at an intensity of about 100 mW/cm$^2$. After UV curing, the PUA mold is peeled off from the master and it has a modulus of about 320 MPa, which is enough modulus to prevent deformation while the elastomeric PDMS cushion layer (2 MPa of modulus) underlying the rigid PUA external pattern surface is easily deformed.

A remodeled UV light source (CS2010, Thorlabs) 530 is installed inside of hollow quartz cylinder roller device core 512. A wavelength is fixed on about 365 nm and intensity is regulated by a controller in the range of 0 to about 200 mJ/cm$^2$. A positive i-line photoresist like Shipley Microposit™ 1805 (comprising propylene glycol monomethyl, mixed cresol novolak resin, fluoroaliphatic polymer esters, and diazo photoactive compound) is spin-coated on a substrate comprising a conductive metal layer (aluminum (Al)) at 4,000 rpm for about 30 seconds. After baking at 95° C. for about 1 minute, the photoresist-coated Al substrate is put on a moving stage and the moving stage is elevated until the Al and photoresist coated substrate makes contact with the roll phase mask. Due to the contact, stage movement in perpendicular direction to cylinder axis rotates the roll phase mask and thus a continuous fabrication system occurs. An exposed sample with proper intensity is developed in about 1 minute with MIF-319 (Shipley).

Figure 3:
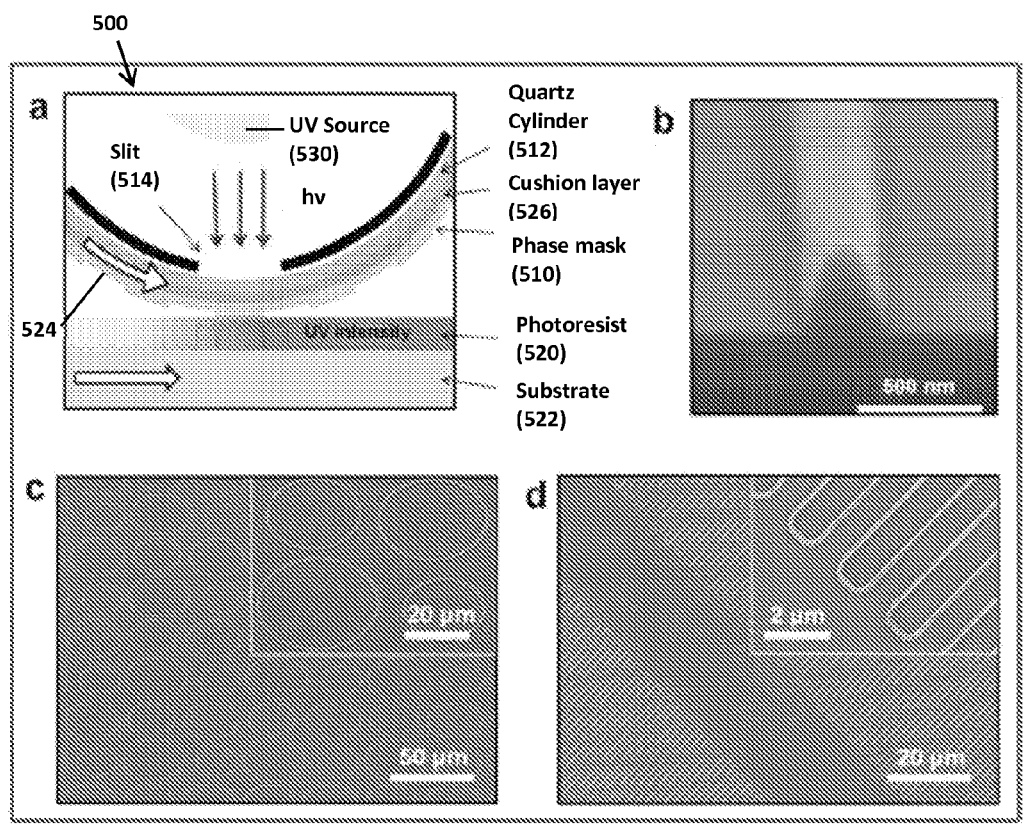

As shown in FIG. 3(a), a roll type phase mask 510 in accordance with certain aspects of the present disclosure comprises five components, namely a UV-source 530, a quartz cylinder core 512, a slit 514 formed in the quartz cylinder 512, a cushion layer 526, and a more rigid patterned external layer 524. To make a uniform direction of UV light along the slit, a collimated lens is installed on the internally disposed UV LED source. A deformation of the cushion layer 526 lets the roll type phase mask 510 be slightly flattened along the slit (1 mm in width) 514 and thus partial plate to plate contact can be obtained. It restores a part of roll mask by rotation. Due to this deformation, the contact portion of the phase mask 510 can be considered like normal phase lithography and UV intensity shows about a zero value at the edges of phase mask structure.

The SEM image in FIG. 3(b) represents a fabricated photoresist line pattern and it has rounded triangular shape, 250 nm width in bottom part and sub 100 nm width in the top part of the structure formed. As shown in FIGS. 3(c)-(d), various shapes of masks can be applied and produce various looped line patterns. Reproducibility of this fabrication method is up to 90%, which is remarkable as compared with prior art formation techniques for similar structures.

Figure 4:
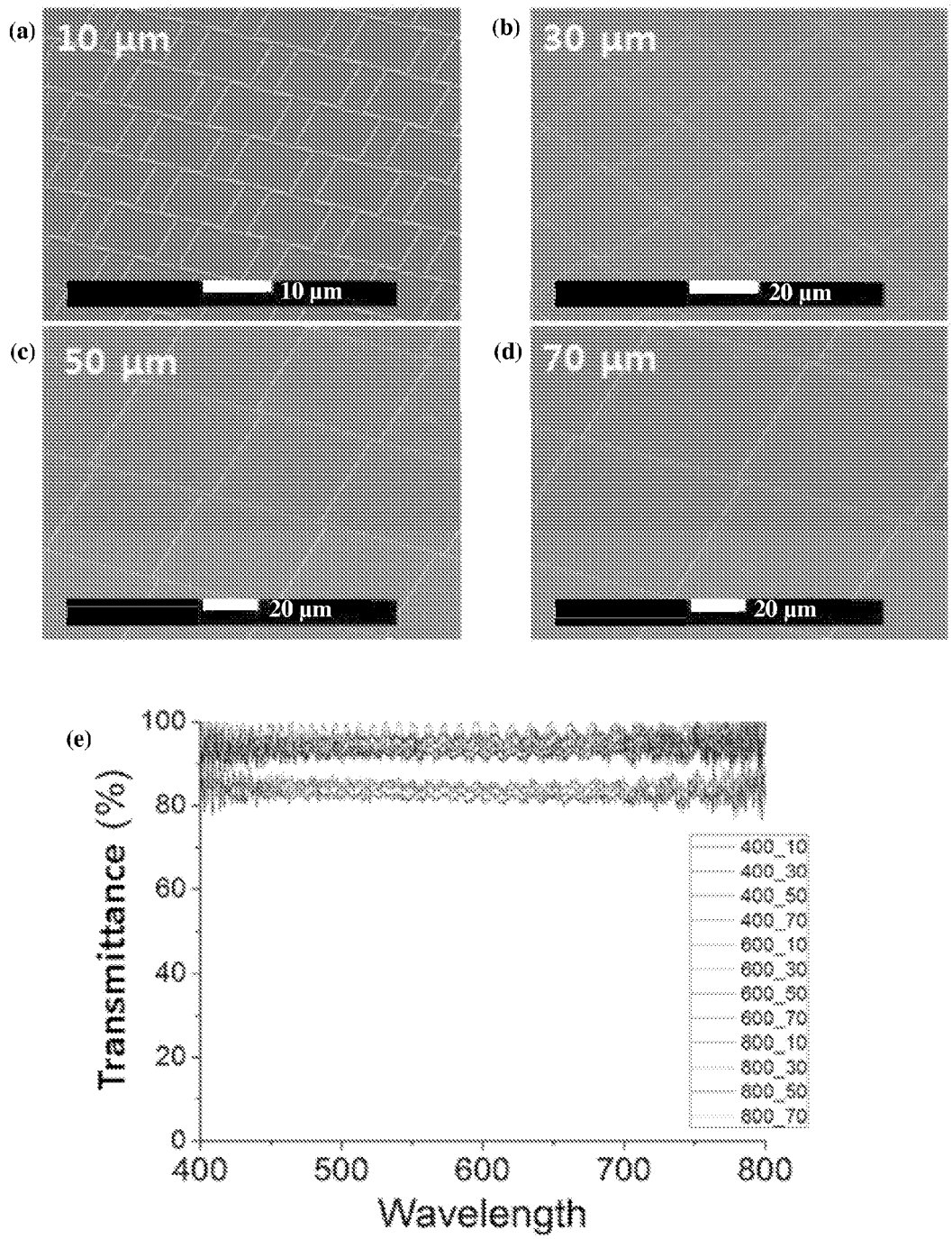

FIGS. 4(a)-(e) show the initial results obtained by a combination of roll to roll (R2R) phase shift lithography to pattern a photoresist grid pattern by using the patterned resist mask, such as that shown in FIGS. 1(b) and 2(a), followed by plasma etching of Al film. FIGS. 4(a)-(d) show SEM of fabricated Al grids after such processing by R2R phase lithography and Al dry etching at 10 μm, 30 μm, 50 μm, and 70 μm respectively. FIG. 4(e) shows the optical transmittance measured from samples of various grid dimensions in FIGS. 4(a)-(d). Transparency greater than 80% and over 90% can be easily obtained by adjusting the grid geometry. The measured sheet resistance ranges from 50 ohm to over 800 ohm/square. These values are appropriate for various applications; and can be easily tuned by changing the grid size and the conductive material thickness.

Wire grid transparent conductors can be used as a transparent conductive electrode (TCE) having high transparency and conductivity. The transparent metal electrodes can be fabricated using certain phase shift lithography techniques described herein and involve two design considerations: 1) a line-width of the metal mesh is designed to be sub-wavelength to provide sufficient transparency and to minimize light scattering and reflection; 2) a period of the mesh is chosen to be submicron to ensure the uniformity of the current collection from organic semiconductors. This mesh serves as the main part of the transparent metal electrode. An orthogonal mesh ensures the electrical connectivity of the main grating lines in case some of lines become disconnected due to one or more defects in the fabrication process. The optimum period of metal grating can be determined by considering the sheet resistance of poly(3,4-ethylenedioxythiophene):poly(styrenesulfonate) (PEDOT:PSS), which in turn determines the voltage drop between the adjacent metal lines as the photocurrents are collected. The total voltage drop in the device area, assumed to be 0.1 $cm^2$, can then be estimated by considering the number of metal lines in the whole device area at certain period of grating. If total voltage drop is assumed to be about 10 mV, then the optimum period can be determined.

As shown in FIGS. 7(a) and 7(b), the optimum period of the transparent metal electrode can be found in the shaded area for organic photovoltaics (OPVs) made with conductive PEDOT transporting layer. FIG. 7(b) shows the multi-layer OPV structure includes a copper mesh electrode or a conventional ITO electrode on PEDOT formed over a PET substrate. The structure includes a PEDOT:PSS layer, a P3HT and PCBM layer and a counterelectrode comprising LiF/Al. The voltage versus current density is shown for both of the Cu mesh electrode and the ITO electrode OPV structures. The closer to the lower left corner of FIG. 7(a), the better the OPV performance will be. Outside the red area the transparent metal electrode will still be able to collect generated photocurrent, but with reduced efficiency. Initial results using the patterned Cu mesh electrode show similar performance to that using the conventional ITO electrode (FIG. 7(b)). As described by M.-G. Kang, M.-S. Kim, J. Kim, and L. J. Guo, "Organic solar cells using nanoimprinted transparent metal electrodes," *Adv. Mater.*, vol. 20, pp. 4408-4413, 2008. An optimum period of the transparent metal electrode nanopatterned metal grating can be calculated as a function of sheet resistance of the PEDOT:PSS layer. Choosing the metal grating period and the PEDOT sheet resistance within certain regions can lead to negligible loss of photocurrent and improved OSC performance.

In certain variations, large area transparent metal electrodes are fabricated by near-field optical nanolithography methods according to the present teachings, which due to its inherent high resolution and high throughput features is well suited for such methods of formation. The details of the fabrication of the transparent metal electrodes are described in the documents: M.-G. Kang, M.-S. Kim, J. Kim, and L. J. Guo, "Organic solar cells using nanoimprinted transparent metal electrodes," Adv. Mater., vol. 20, pp. 4408-4413, 2008; M.-G. Kang and L. J. Guo, "Nanoimprinted semitransparent metal electrodes and their application in organic light emitting diodes," Adv. Mater., vol. 19, pp. 1391-1396, 2007; and U.S. Pat. No. 8,027,086 titled "Roll to Roll Nanoimprint Lithography" to Guo et al., which are incorporated herein by reference. For example, a fabricated mold with a period of 700 nm and line-width of 70 nm for the main grating can be employed. A secondary grating with a period of 10 μm and a line-width of 400 nm can be used to ensure the electrical connectivity of the main grating while minimizing transmittance loss. Nano-scale patterning of the metal film provides a high transparency conductive electrode whose transmittance is comparable to commercially available standard ITO electrodes.

Such transparent conductive electrodes (TCE) can include a periodic nano-scale metal wire grid fabricated by phase shift lithography and have high optical transparency, good electrical conductivity. Moreover, unlike ITO, those properties are adjusted independently by changing the metal line width and thickness in the metal grid structure corresponding to the patterned phase mask surface. Such a TCE also exhibits greatly improved mechanical flexibility and durability. Not only do metal electrodes provide excellent optical transmittance and electrical conductivity, but also the nano-scale metallic nano-wire structures exhibit unique optical properties due to the excitation of surface plasmon resonance (SPR), which can be exploited in specially designed plasmonic color filters and polarizers.

For example, nano-scale patterned metal film provides high transparency conductive electrodes whose transmittance is comparable to the commercially available standard ITO electrode as shown in FIG. 8(a). High transparency metal electrodes using Au, Cu and Ag are shown, but any other metals can be used for this purpose as well. FIG. 8(b) shows the typical behavior of the average transmittance of the metal electrode in the visible range as a function of different sheet resistance. Transparent metal electrodes with a line-width of 120 nm are considered in this case. As shown in FIG. 8(b), the sheet resistance of the metal electrode can be decreased to less than a few ohms per square with only a small decrease of the average transmittance. This characteristic is another advantage over an ITO electrode, in which the sheet resistance has to be compromised in order to achieve high transmittance.

A fabricated Cu grating electrode formed in accordance with certain phase shift lithography techniques of the present teachings are found to be much more flexible than a conventional ITO electrode, as demonstrated by simple bending test results shown in FIGS. 9(a)-(c). Normalized conductance is shown in FIG. 9(a) versus an inverse of a radius of curvature of the Cu wire mesh (●) and the ITO electrode (■). SEM images of the ITO electrode are shown in FIG. 9(b), while the Cu mesh electrode is shown in FIG. 9(c) after the bending tests. In contrast to Cu mesh structure, the ITO severely cracked from the bending. In the case of the transparent Cu electrode grating or mesh, it can be bent to about 3 mm radius of curvature with no degradation of the conductance. On the other hand, the ITO exhibited a reduction of the conductance even at a radius of about 30 mm, which can reach close to zero due to the micro-cracking in ITO film on the order of 20 μm after the bending. Thus, transparent conductive electrodes formed in accordance with certain aspects of the present teachings demonstrate excellent flexibility and durability.

The fabrication of the nanopatterned metal electrode using the metal transfer printing technique can be extended to cost effective and large area fabrication such as roll-to-roll nanoimprint lithography (R2RNIL) with the use of flexible molds. For example, in accordance with certain aspects of the present disclosure, nano-scale metal (e.g. Au) gratings on large area PET substrates using a roll-to-roll transfer printing process are successfully conducted.

As an application, a metal transparent electrode is developed by fabricating a metal grating in a mesh pattern. Theoretically, a perfect checkerboard phase mask, shown in FIG. 10(a), should lead to a mesh pattern. In real fabrication process of photomasks and silicon masters; however, vertexes of developed pattern are rounded by development. The rounding can be minimized by using thin layers of photoresist (PR); however, even with such a modification, a few hundred nanometers of gap between vertexes of two squares is still observed, as shown in FIG. 10(b). A new design of mask is developed to address the issues associated with such phase masks. Based on simulation results (by Comsol multiphysics software) shown in FIGS. 10(c)-(d), a deliberate small gap (about 300 nm) between neighboring structures is able to secure a connection of them. For the simulation of a normal sample, which has 600 nm in width and 600 nm in space, it makes 200 nm width of a dark spot. On the other hand, in the case of modified structure in FIG. 10(d), two dark spots are merged together and relatively wide dark spot is expressed with about 300 nm width. To apply this simulation result to experiment, a modified checkerboard mask is designed with dislocated squares. A small space (about 300 nm) between two neighboring squares is obtained by a stepper process. FIG. 10(e) shows a schematic diagram of 5 times pattern reduction process by using such a stepper in the pattern. Overlapped length and space between two squares are fixed with 15 μm and 1.5 μm, respectively and they are reduced to 3 μm and 300 nm. While those values are fixed, a side length of a square is decided by target period of mesh pattern. In FIGS. 10(f)-(g), a fabricated PUA mold as a phase mask is shown with 30 μm in period. The height of phase mold for the phase mask is determined by refractive index of patterned material and wavelength of used UV light. It is expressed by $h=\lambda/(2\Delta n)$, where $\lambda$ is wavelength of UV light and $\Delta n$ is difference of index of refraction between the phase mask and surroundings. Here, the PUA phase mask has 375 nm because PUA has 1.49 of refractive index when it is cured. Without an external physical scratch and contamination by unbaked photoresist layer, such a PUA phase mask can be used over 500 times.

With further dry etching, two different periodic aluminum mesh patterns are fabricated on glass substrate as shown in FIG. 11(a) (10 μm in period) and FIG. 11(b) (30 μm in period). The Al etching is performed in $BCl_3/Cl_2$ plasma-enhanced by a magnetic field. The Al layer etching process comprises two steps; a first step comprises etching native aluminum oxide using $BCl_3$ of 40 sccm for 5 seconds with RF power of 100 W and a working pressure of 10 mT. A second step etches the aluminum layer by changing $BCl_3$ to 20 sccm and adding $Cl_2$ of 6 sccm with same RF power and working pressure as the first step. He and Ar gas are maintained for flow amounts of 50 sccm and 20 sccm, respectively, and etching time for second step is controlled at 20 sec, 30 sec, and 40 sec for 40 nm, 60 nm, and 80 nm in target etching thickness, respectively. The etch selectivity of photoresist S1805 versus aluminum is higher than 1:1 and therefore the photoresist on top of the Al pattern is removed using a PR-remover after the etching. According to expectation from simulation, overlapped part of two squares are well connected with thicker width. FIG. 11(c) shows a connected part and it has about 360 nm in width which is about twice that of a single line width, 170 nm. Due to limitations of the light source size and linear motion system's stroke, patterned area in this experiment is limited to an area of 1 cm by 1 cm, but it demonstrates that such techniques can be expanded to extremely large area fabrication, such as $12^{th}$ generation LCD panel fabrication (3350 mm by 3950 mm). A large area sample fabricated with such a technique is shown in FIG. 11(d). Because its transparency is about 90%, it looks almost transparent with bare eyes. This is supported by a simple calculation of opening area of metal mesh patterns; 95% and 98% of opening portion for 10 μm and 30 μm period samples, respectively.

FIG. 12 shows experimental data obtained for various conditions of exposure intensity and developing time. These experimental findings can be classified into six categories: under exposing, reversed pattern, under developed conditions, optimum patterning, over developed conditions, and over exposing. In this experiment, exposure intensity is proportional to UV light intensity because exposing time is followed by fixed substrate moving speed. The ranges of exposure intensity are 25 to 45 $mJ/cm^2$ and develop time is 50 to 75 seconds. With weak UV light, an inverted pattern is observed. From the second column, progress of develop is from connected part to center of squares as time goes by. Due to this phenomenon, residual photoresist in the center of square is shown in the case of short develop time and disconnected patterns is observed in over-developed case even though UV exposure intensity is at a proper level.

For performance tests on transparent metal electrode, transmittance and sheet resistance of six different samples are measured. As shown in FIG. 13(a), transmittance of a mesh pattern is governed by its period while there are not notable differences according to thickness. Regardless of thickness, 10 μm periodic patterns have around 85% of transmittance and 30 μm periodic patterns have 92%. These values are slightly smaller than opening area calculation. Small defects are believed to occur during developing and etching processes, which are the likely causes of the diminished transmittance. Sheet resistance for each case can be calculated by simple Ohm's law and it is expressed by blue bars in FIG. 13(b). From the calculated values, it can be recognized that sheet resistance is proportional to period and inverse of metal thickness. To measure sheet resistance, metal pads are deposited on each metal mesh pattern with two different distances (100 μm and 200 μm). By solving the simultaneous equations, which can erase the term of contact resistance, sheet resistance of mesh pattern is measured and those values are shown in FIG. 13(b). A certain amount of error between measured and calculated values results from a couple of disconnections of metal lines or other measurement errors. For six samples, sheet resistance is measured in the range of 57 to 195 Ohm/square ($\Omega/\square$). In comparison with typical sheet resistance of a 100 nm thick ITO, of about 80$\Omega/\square$, a metal transparent electrode fabricated in accordance with certain aspects of the present teachings is a viable alternative to a conventional ITO electrode.

Thus, the present disclosure provides simple lithographic methods for fabricating sub-wavelength scale patterns. Further, such lithography techniques can be used to fabricate transparent metal electrodes in accordance with certain aspects of the present teachings. The present methods of lithographic formation can be used for large patterned areas on a diversity of substrates, thus this technique can be applied to large area devices, flexible displays, and the like. Furthermore, residual layer free sub-wavelength scale pattern are achieved in large areas when using phase shift lithography methods according to certain aspects of the present teachings, thereby overcoming limitations of photolithography and roll to roll imprinting.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for forming a conductive micro-grating or nano-grating structure comprising:
    passing a substrate comprising a layer of conductive
        material having a radiation curable photoresist material disposed thereon under a rigid patterned surface of a roller phase mask device having a transparent cushion layer comprising an elastomeric polymer disposed beneath the rigid patterned surface, wherein the roller phase mask has a modified checkerboard pattern comprising dislocated rectangular units which overlap along only one axis with a neighboring rectangular unit and having at least one gap defined between neighboring rectangular units;

directing radiation from inside the roller phase mask device through one or more regions of the rigid patterned surface to the radiation curable photoresist material, so as to produce an optical phase shift to cure one or more preselected regions of the radiation curable photoresist material on the substrate, wherein the radiation is either generated from a radiation source disposed inside the roller phase mask device or the radiation is reflected by a reflector device disposed inside the roller phase mask device that reflects radiation from an external source directed at the roller phase mask device, wherein the one or more preselected regions define a first plurality of rows and a second plurality of rows distinct from the first plurality of rows;

removing the uncured photoresist material and the underlying conductive material in regions outside the one or more preselected regions; and removing the cured photoresist material from the one or more preselected regions wherein a portion of the first plurality of rows intersect with and contact a portion of the second plurality of rows in one or more connected regions, so that the underlying conductive material defines the conductive micro-grating or nano-grating structure as a connected grid pattern having a transparency for visible light of greater than or equal to about 80%, wherein the one or more connected regions have a first width which is about twice a second width of the first plurality of rows and the second plurality of rows outside the one or more connected regions.

2. The method of claim 1, wherein the passing further comprises contacting the rigid patterned surface with the radiation curable photoresist material.

3. The method of claim 1, wherein the passing and directing radiation occur concurrently to one another.

4. The method of claim 1, wherein said passing, directing radiation, the removing the uncured photoresist material and the underlying conductive material and the removing of the cured photoresist material are conducted in a continuous roll-to-roll process.

5. The method of claim 1, wherein said rigid patterned surface comprises a polymeric material that is transparent to the radiation.

6. The method of claim 1, wherein the elastomeric polymer of the cushion layer comprises polydimethylsiloxane (PDMS) and the rigid patterned surface comprises polyurethaneacrylate (PUA).

7. The method of claim 1, wherein said roller phase mask device further comprises a hollow core comprising at least one slit over which said rigid patterned surface is disposed.

8. The method of claim 1, wherein the conductive micro-grating or nano-grating structure is a transparent conductive electrode.

9. The method of claim 1, wherein the conductive material is selected from the group consisting of: graphene, aluminum (Al), gold (Au), copper (Cu), silver (Ag), and combinations and alloys thereof.

10. The method of claim 1, wherein the conductive micro-grating or nano-grating structure is capable of transmitting electromagnetic waves in a first range of wavelengths while blocking electromagnetic waves in a second range of wavelengths distinct from the first range.

11. The method of claim 1, wherein the conductive micro-grating or nano-grating structure has a sheet resistance ranging from 50 ohm/square to about 800 ohm/square.

12. The method of claim 1, wherein the at least one gap is about 300 nm.

13. The method of claim 1, wherein a period between respective rows of the first plurality of rows is greater than or equal to about 10 μm to less than or equal to about 5 mm.

14. A method for forming a conductive micro-scale or nano-scale grating structure, the method comprising:

passing a substrate comprising a layer of conductive material having a radiation curable photoresist material disposed thereon under a rigid patterned surface of a roller phase mask device, wherein the rigid patterned surface forms a phase mask having a transparent cushion layer comprising an elastomeric polymer disposed beneath the rigid patterned surface, wherein the roller phase mask has a modified checkerboard pattern comprising dislocated rectangular units which overlap along only one axis with a neighboring rectangular unit and having at least one gap defined between neighboring rectangular units;

generating radiation from a radiation source disposed inside the roller phase mask device that passes through one or more regions of the rigid patterned surface to the radiation curable photoresist material, so as to produce an optical phase shift to cure one or more preselected regions of the radiation curable photoresist material on the substrate, wherein the one or more preselected regions define a first plurality of rows and a second plurality of rows distinct from the first plurality of rows;

etching the substrate to remove uncured photoresist material and the underlying conductive material in regions outside the one or more preselected regions; and removing the cured photoresist material from the one or more preselected regions, wherein a portion of the first plurality of rows intersect with and contact a portion of the second plurality of rows in one or more connected regions, so that the underlying conductive material defines the conductive micro-scale or nano-scale grating structure as a connected grid pattern having a transparency for visible light of greater than or equal to about 80%, wherein the one or more connected regions have a first width which is about twice a second width of the first plurality of rows and the second plurality of rows outside the one or more connected regions.

15. The method of claim 14, wherein the conductive micro-scale or nano-scale grating structure is a transparent conductive electrode.

16. The method of claim 14, wherein the passing further comprises contacting the rigid patterned surface with the radiation curable photoresist material.

17. The method of claim 14, wherein the passing and generating occur concurrently to one another.

18. The method of claim 14, wherein said passing, generating, etching, and removing are conducted in a continuous roll-to-roll process.

19. The method of claim 14, wherein the elastomeric polymer of the cushion layer comprises polydimethylsiloxane (PDMS) and the rigid patterned surface comprises polyurethaneacrylate (PUA).

20. The method of claim 14, wherein the conductive material is selected from the group consisting of: graphene, aluminum (Al), gold (Au), copper (Cu), silver (Ag), and combinations and alloys thereof.

21. The method of claim 14, wherein the at least one gap is about 300 nm.

22. The method of claim 14, wherein a period between respective rows of the first plurality of rows is greater than or equal to about 10 μm to less than or equal to about 5 mm.

23. A method for forming a transparent conductive electrode structure by phase shift lithography, the method comprising:
passing a substrate comprising a layer of conductive material having a radiation curable photoresist material disposed thereon under a rigid patterned surface of a roller phase mask device, wherein the rigid patterned surface forms a phase mask having a transparent cushion layer comprising an elastomeric polymer disposed beneath the rigid patterned surface, wherein the roller phase mask has a modified checkerboard pattern comprising dislocated rectangular units which overlap along only one axis with a neighboring rectangular unit and having at least one gap defined between neighboring rectangular units;
generating radiation from a radiation source disposed inside the roller phase mask device that passes through one or more regions of the rigid patterned surface to the radiation curable photoresist material, so as to produce an optical phase shift to cure one or more preselected regions of the radiation curable photoresist material on the substrate, wherein the one or more preselected regions define a first plurality of rows and a second plurality of rows distinct from the first plurality of rows;
etching the substrate to remove uncured photoresist material and the underlying conductive material in regions outside the one or more preselected regions; and
removing the cured photoresist material from the one or more preselected regions wherein a portion of the first plurality of rows intersect with and contact a portion of the second plurality of rows in one or more connected regions, so that the underlying conductive material defines a conductive micro-scale grating structure in a connected grid pattern having a transparency for visible light of greater than or equal to about 80% for use as the transparent conductive electrode structure, wherein the one or more connected regions have a first width which is about twice a second width of the first plurality of rows and the second plurality of rows outside the one or more connected regions.

24. The method of claim 23, wherein the rigid patterned surface comprises polyurethaneacrylate (PUA) and the conductive material is selected from the group consisting of: graphene, aluminum (Al), gold (Au), copper (Cu), silver (Ag), and combinations and alloys thereof.

25. The method of claim 23, wherein the at least one gap is about 300 nm.

26. The method of claim 23, wherein a period between respective rows of the first plurality of rows is greater than or equal to about 10 μm to less than or equal to about 5 mm.

27. A method for forming a conductive micro-grating or nano- grating structure comprising:
passing a substrate comprising a layer of conductive material having a radiation sensitive positive resist material disposed thereon under a rigid patterned surface of a roller phase mask device having a transparent cushion layer comprising an elastomeric polymer disposed beneath the rigid patterned surface, wherein the roller phase mask has a modified checkerboard pattern comprising dislocated rectangular units which overlap along only one axis with a neighboring rectangular unit and having at least one gap defined between neighboring rectangular units;
directing radiation from inside the roller phase mask device so that radiation passes through one or more regions of the rigid patterned surface to the radiation sensitive positive resist material, so as to produce an optical phase shift to modify one or more preselected regions of the radiation-exposed sensitive positive resist material on the substrate to be susceptible to a developer, wherein the radiation is either generated from a radiation source disposed inside the roller phase mask device or the radiation is reflected by a reflector device disposed inside the roller phase mask device that reflects radiation from an external source directed at the roller device, wherein regions outside the one or more preselected regions define a first plurality of rows and a second plurality of rows distinct from the first plurality of rows; and
exposing the substrate to the developer and removing the one or more preselected regions of the radiation-exposed sensitive positive resist material wherein a portion of the first plurality of rows intersect with and contact a portion of the second plurality of rows in one or more connected regions, so that the underlying conductive material defines the conductive micro-grating or nano-grating structure in the one or more preselected regions as a subwavelength connected grid pattern having a transparency for visible light of greater than or equal to about 80%, wherein the one or more connected regions have a first width which is about twice a second width of the first plurality of rows and the second plurality of rows outside the one or more connected regions.

* * * * *

UNITED STATES PATENT AND TRADEMARK OFFICE
CERTIFICATE OF CORRECTION

PATENT NO. : 9,720,330 B2
APPLICATION NO. : 14/395358
DATED : August 1, 2017
INVENTOR(S) : Lingjie Jay Guo It is certified that error appears in the above-identified patent and that said Letters Patent is hereby corrected as shown below:

On the Title Page

Page 2, Column 2, Item (56) References Cited Foreign Patent Documents, Line 2, delete "KR 10-2011000815 A 1/2011" and insert --KR 10-20110008159 A 1/2011-- therefor In the Specification Column 1, Line 14, after Cross-Reference To Related Applications section, insert --This invention was made with government support under DMR1120187 and CMMI1025020 awarded by the National Science Foundation. The government has certain rights in the invention.-- therefor In the Claims Column 28, Claim 27, Line 7, delete "nano- grating" and insert --nano-grating-- therefor Signed and Sealed this
Twelfth Day of December, 2017

Joseph Matal
*Performing the Functions and Duties of the
Under Secretary of Commerce for Intellectual Property and
Director of the United States Patent and Trademark Office*